United States Patent
Akasaka et al.

(10) Patent No.: US 9,894,775 B2
(45) Date of Patent: Feb. 13, 2018

(54) METHOD OF MANUFACTURING SUBSTRATE AND METHOD OF MANUFACTURING ELECTRONIC DEVICE

(71) Applicant: SONY CORPORATION, Tokyo (JP)

(72) Inventors: Shin Akasaka, Kanagawa (JP); Satoshi Kumon, Tokyo (JP); Kentarou Satou, Kanagawa (JP); Yuki Oishi, Kanagawa (JP)

(73) Assignee: Sony Corporation, Tokyo (JP)

( * ) Notice: Subject to any disclaimer, the term of this patent is extended or adjusted under 35 U.S.C. 154(b) by 25 days.

(21) Appl. No.: 14/905,115

(22) PCT Filed: Jun. 24, 2014

(86) PCT No.: PCT/JP2014/066633
§ 371 (c)(1),
(2) Date: Jan. 14, 2016

(87) PCT Pub. No.: WO2015/008586
PCT Pub. Date: Jan. 22, 2015

(65) Prior Publication Data
US 2016/0165735 A1    Jun. 9, 2016

(30) Foreign Application Priority Data

Jul. 16, 2013    (JP) ................................. 2013-147741

(51) Int. Cl.
*B24B 37/04*    (2012.01)
*H05K 3/26*    (2006.01)
*H05K 3/00*    (2006.01)
*G06F 1/16*    (2006.01)

(52) U.S. Cl.
CPC ............. *H05K 3/26* (2013.01); *B24B 37/042* (2013.01); *G06F 1/16* (2013.01); *H05K 3/007* (2013.01); *H05K 3/0044* (2013.01); *H05K 3/0055* (2013.01); *H05K 2203/016* (2013.01)

(58) Field of Classification Search
CPC ...... H05K 3/26; H05K 3/0044; H05K 3/0055; H05K 3/007; H05K 2203/016; G06F 1/16; B24B 37/042
USPC .................................................... 451/41, 57
See application file for complete search history.

(56) References Cited

U.S. PATENT DOCUMENTS

| | | | | |
|---|---|---|---|---|
| 4,098,032 A | * | 7/1978 | Olbert | G11B 5/6005 125/16.01 |
| 5,405,285 A | * | 4/1995 | Hirano | B24B 49/02 125/13.02 |
| 5,913,712 A | * | 6/1999 | Molinar | B24B 37/04 451/285 |
| 7,048,614 B2 | * | 5/2006 | Uh | B24B 9/06 349/187 |

(Continued)

FOREIGN PATENT DOCUMENTS

| | | |
|---|---|---|
| JP | 2005-157324 | 10/2004 |
| JP | 2004-335968 | 11/2004 |

(Continued)

*Primary Examiner* — George Nguyen
(74) *Attorney, Agent, or Firm* — Chip Law Group

(57) ABSTRACT

There is provided a method of manufacturing a substrate, the method including: polishing a surface of a material substrate; and forming a penalization film on the surface of the material substrate alter the polishing of the surface of the material substrate.

14 Claims, 20 Drawing Sheets

(56) References Cited

U.S. PATENT DOCUMENTS

| | | | | |
|---|---|---|---|---|
| 7,588,482 B2* | 9/2009 | Lee | ............... | B24B 13/015 |
| | | | | 451/159 |
| 7,775,856 B2* | 8/2010 | Bhatnagar | ............... | B24C 1/086 |
| | | | | 451/38 |
| 8,740,670 B2* | 6/2014 | Tanikella | ............ | H04L 29/12028 |
| | | | | 438/692 |
| 2003/0045212 A1* | 3/2003 | Lee | ............... | C25D 11/16 |
| | | | | 451/56 |
| 2005/0179369 A1* | 8/2005 | Ohshita | ............... | H01L 51/0096 |
| | | | | 313/504 |
| 2006/0186409 A1* | 8/2006 | Horino | ............... | G02F 1/136227 |
| | | | | 257/59 |

FOREIGN PATENT DOCUMENTS

| | | |
|---|---|---|
| JP | 2005-258361 | 9/2005 |
| JP | 2010-015123 | 1/2010 |
| JP | 2012-104474 | 5/2012 |
| JP | 2013-067110 | 4/2013 |
| WO | 2012-008166 | 1/2012 |

\* cited by examiner

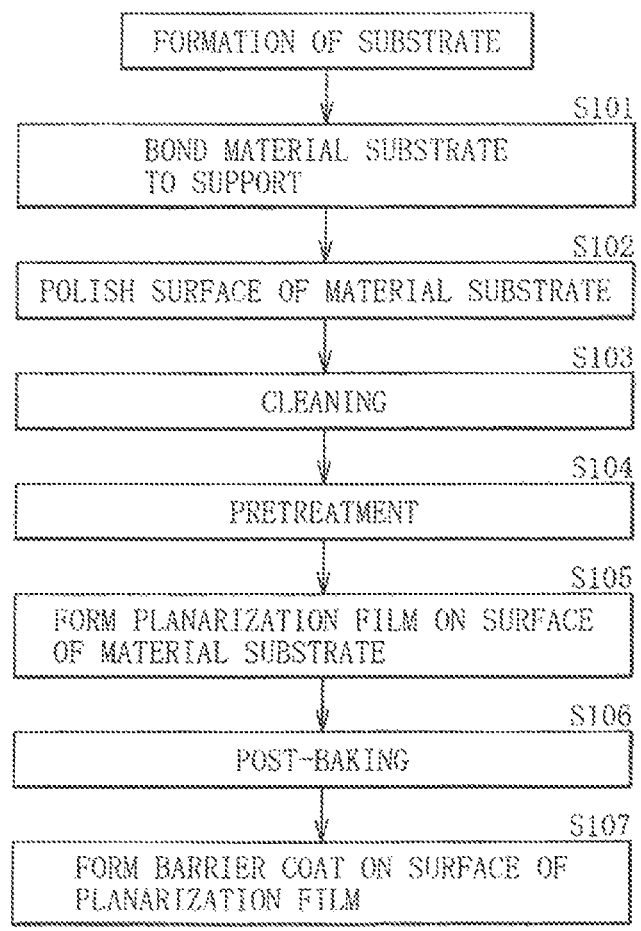

[FIG. 2]
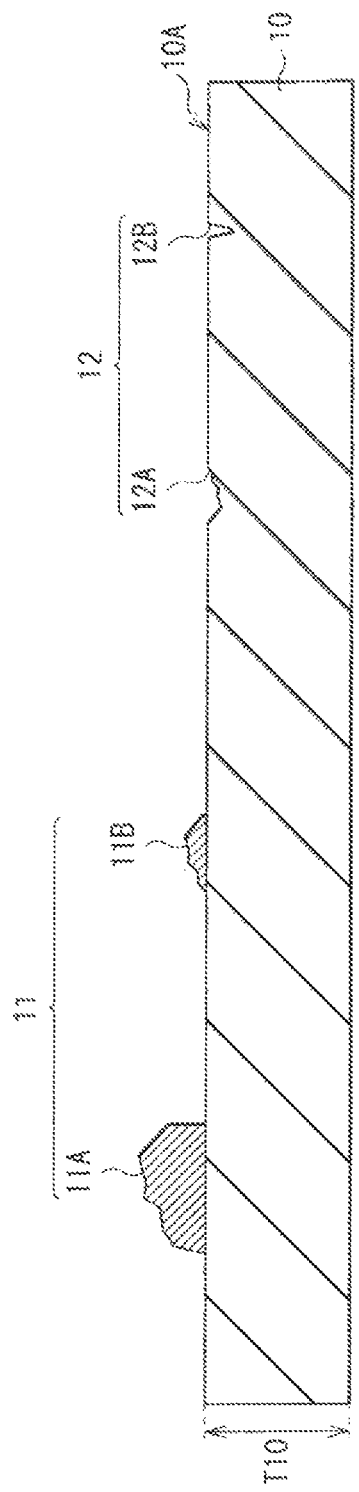

[FIG. 3]
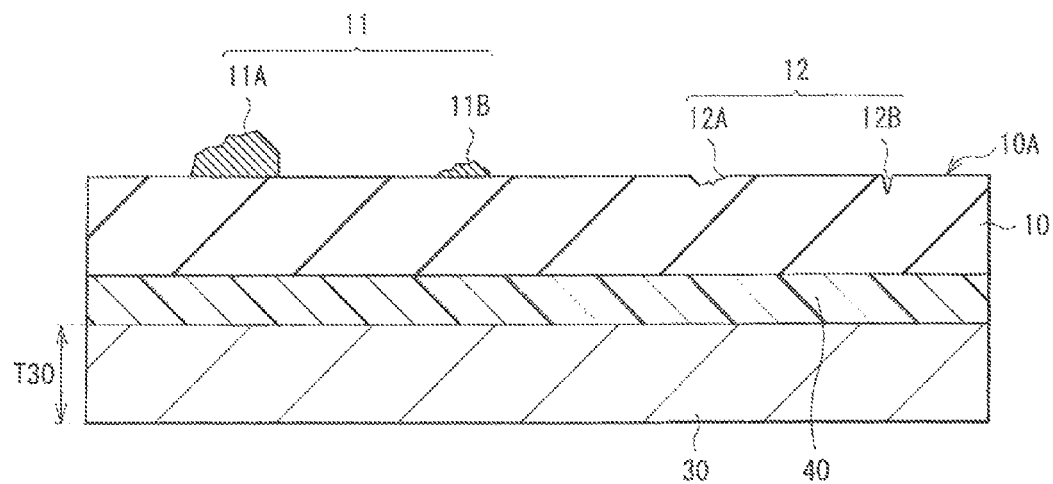
[FIG. 4]
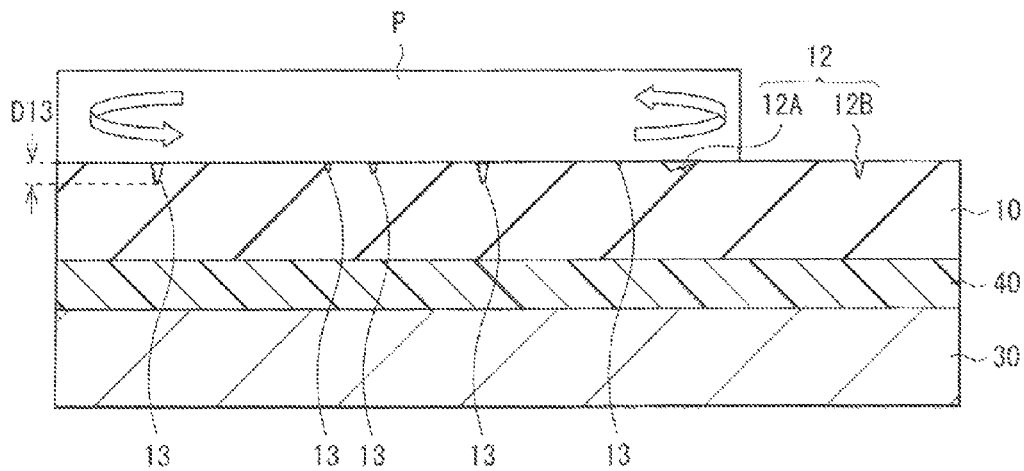

[ FIG. 5 ]
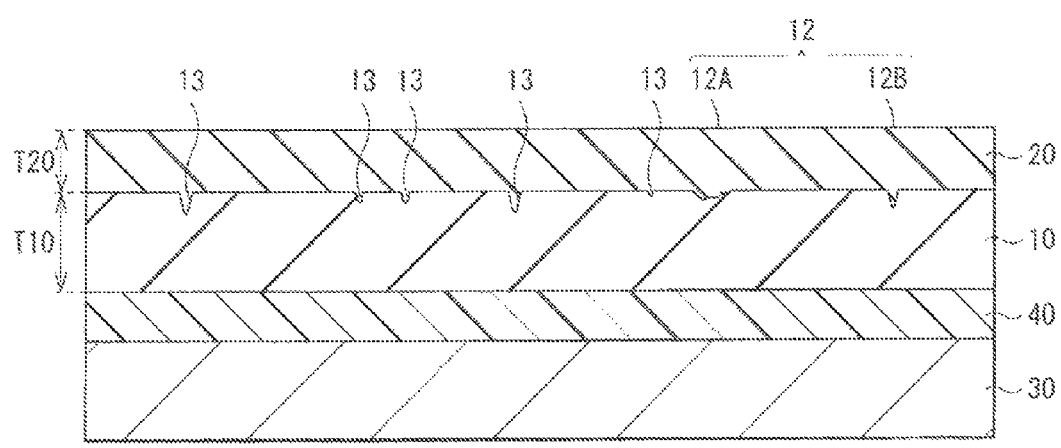
[ FIG. 6 ]
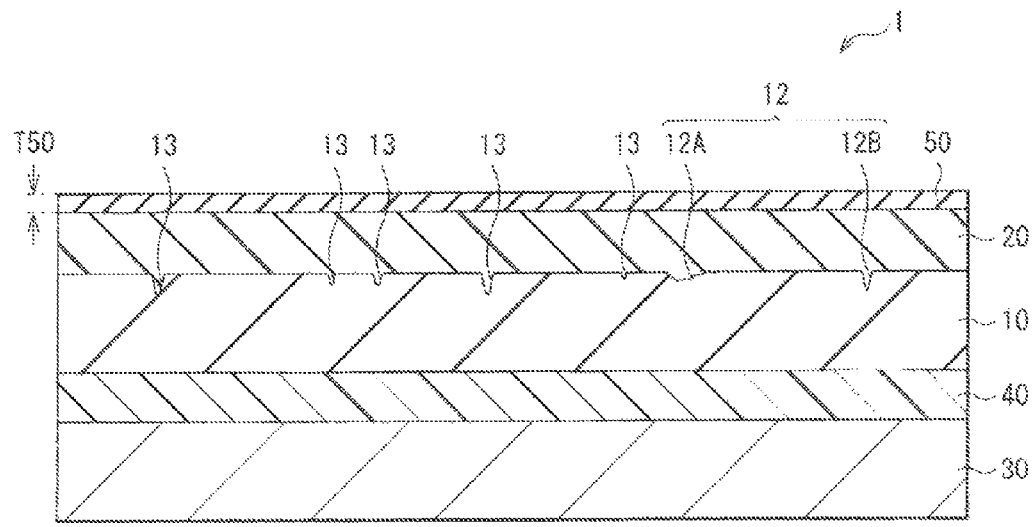

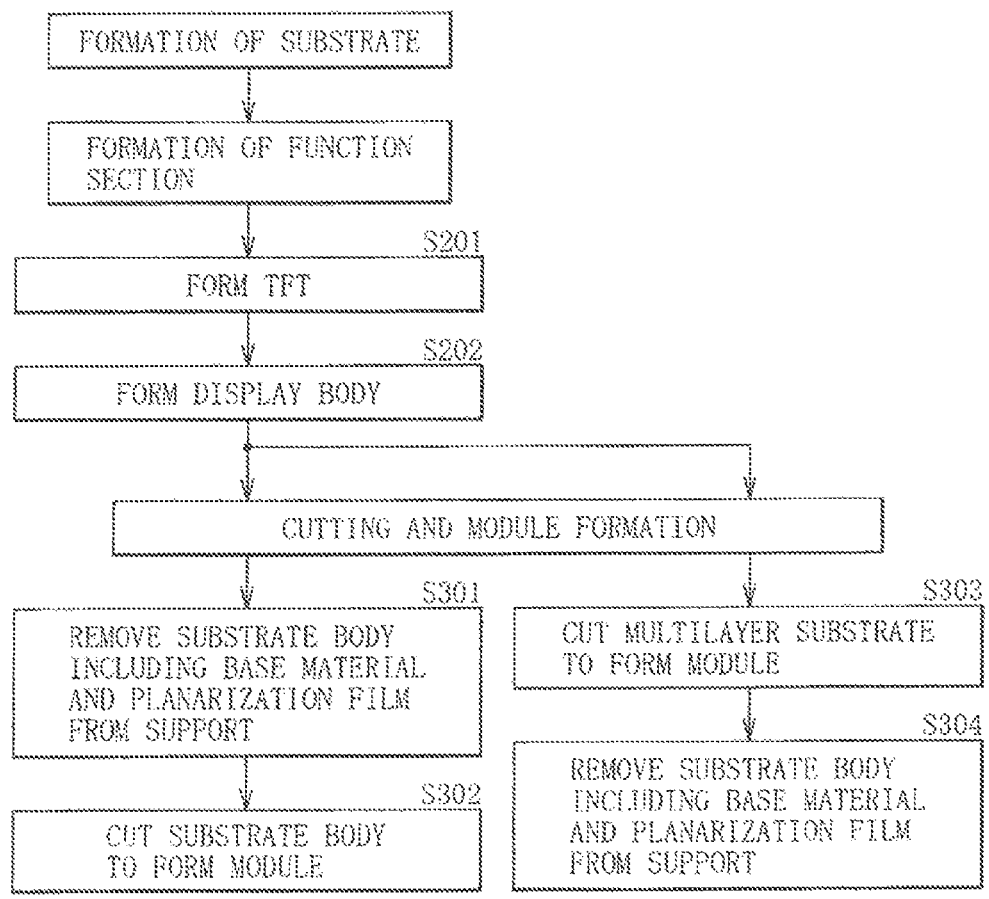
[FIG. 7]

[ FIG. 8 ]
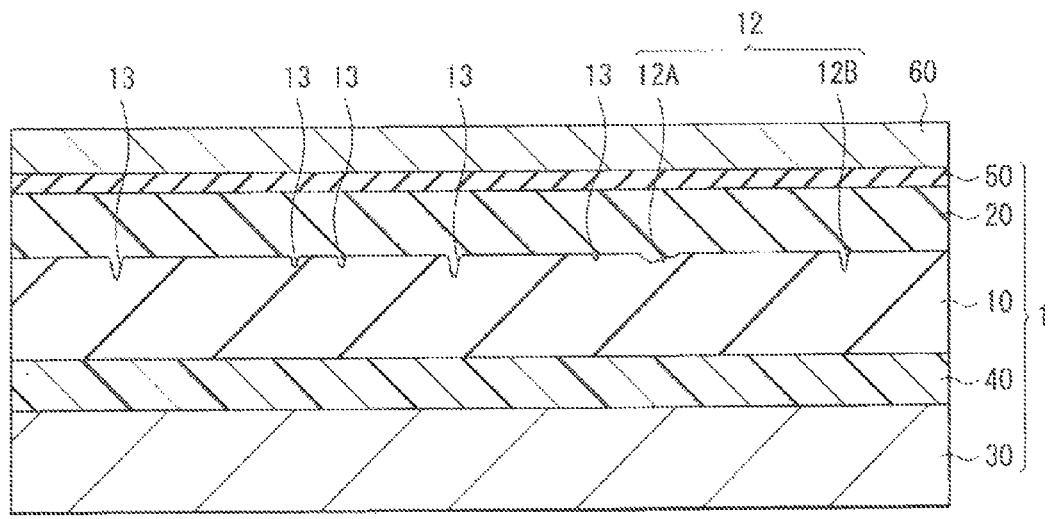
[ FIG. 9 ]
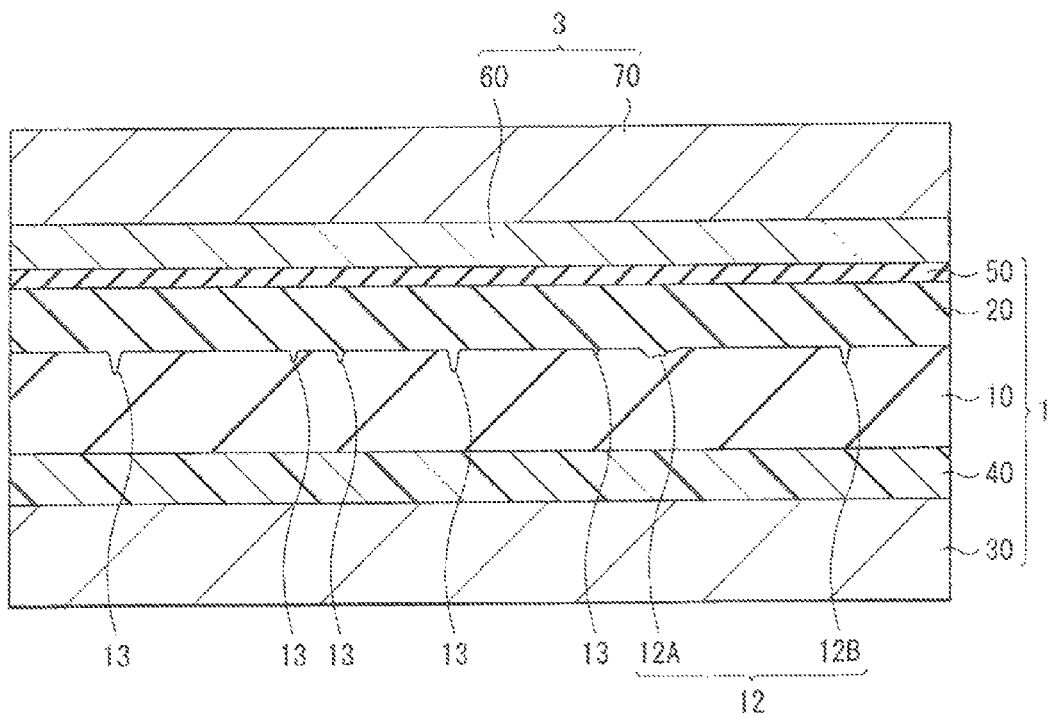

[ FIG. 10 ]
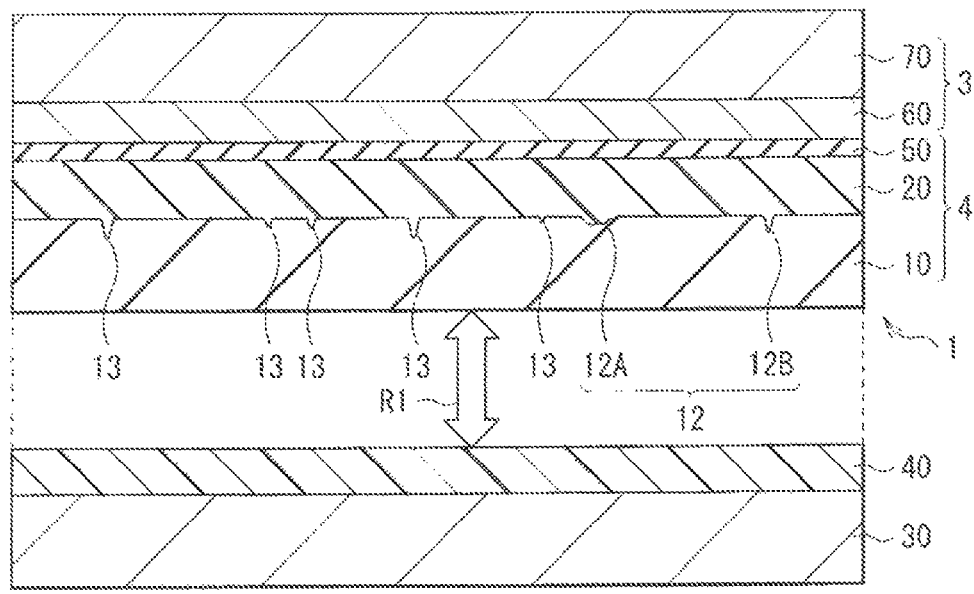
[ FIG. 11 ]
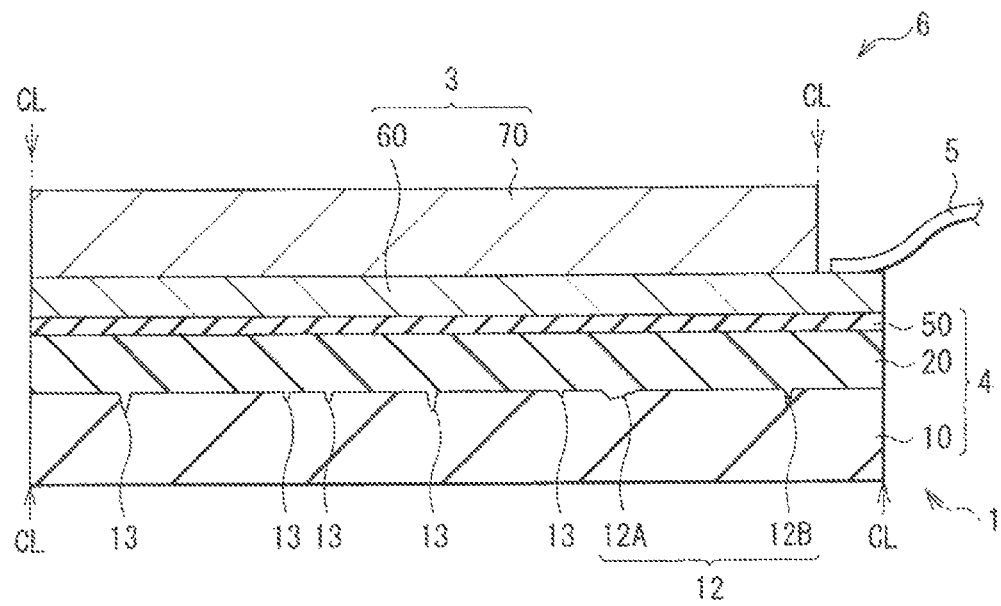

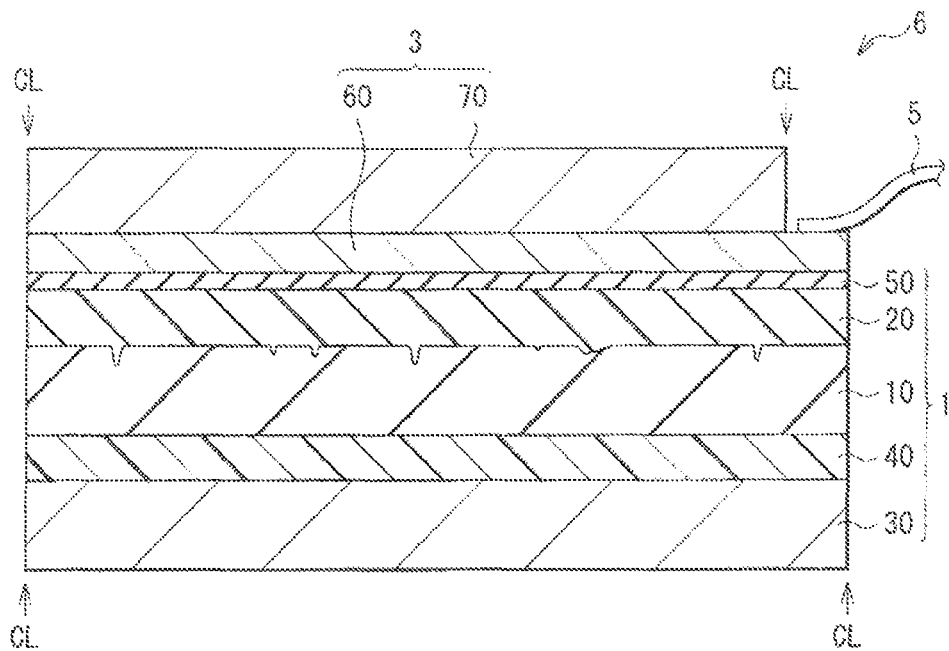
[ FIG. 12 ]
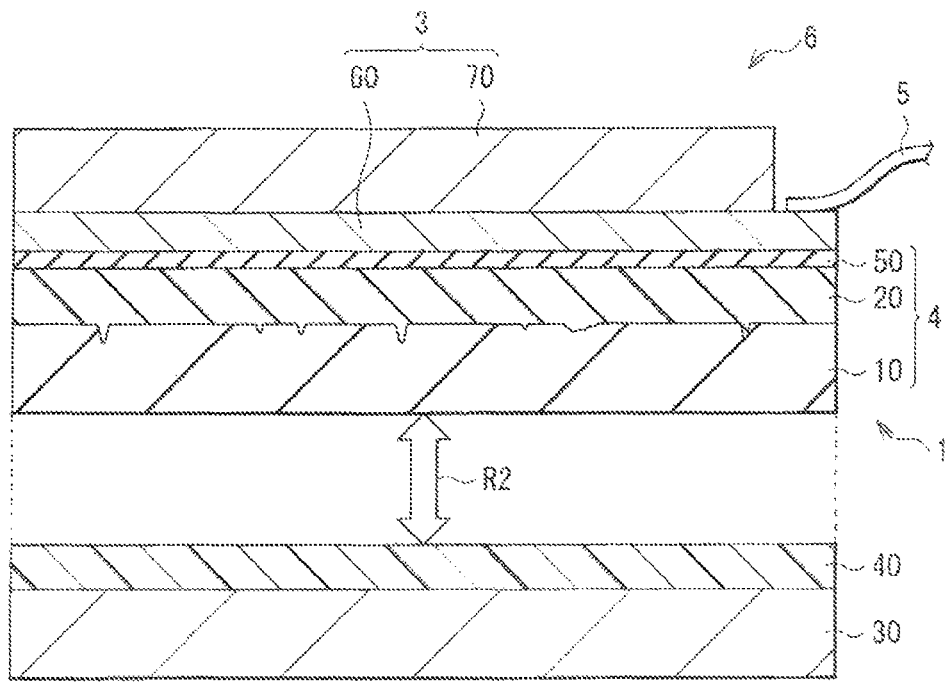
[ FIG. 13 ]

[ FIG. 14 ]
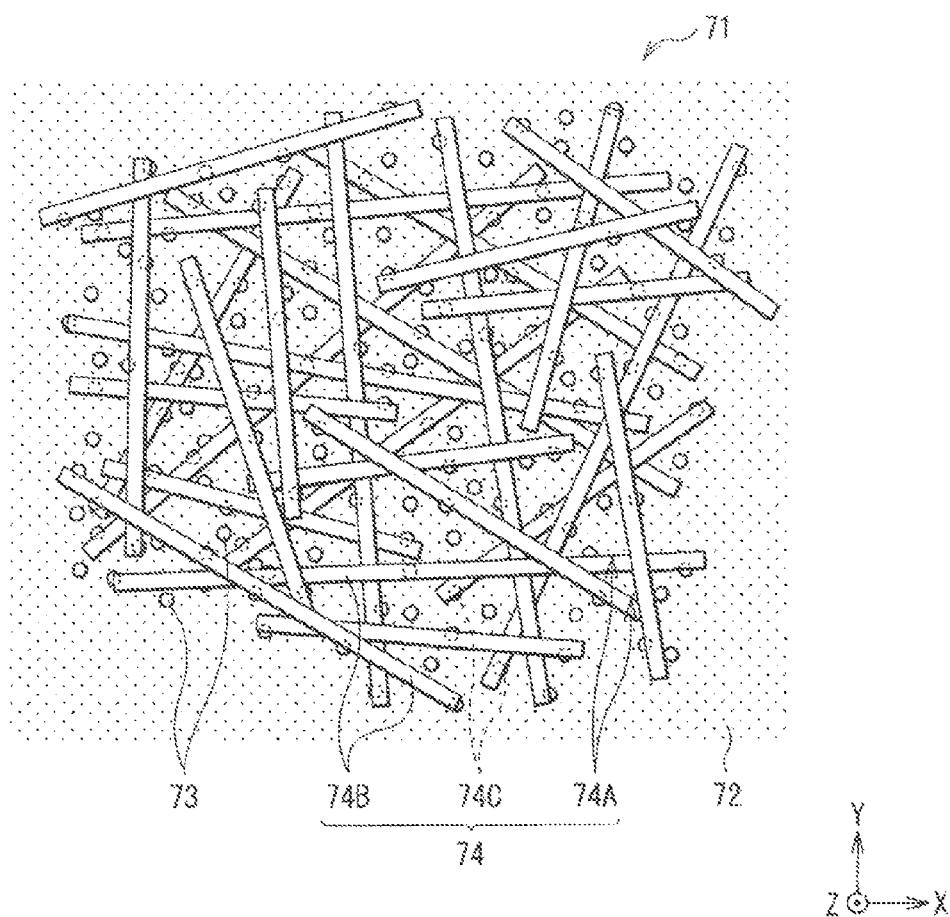
[ FIG. 15 ]
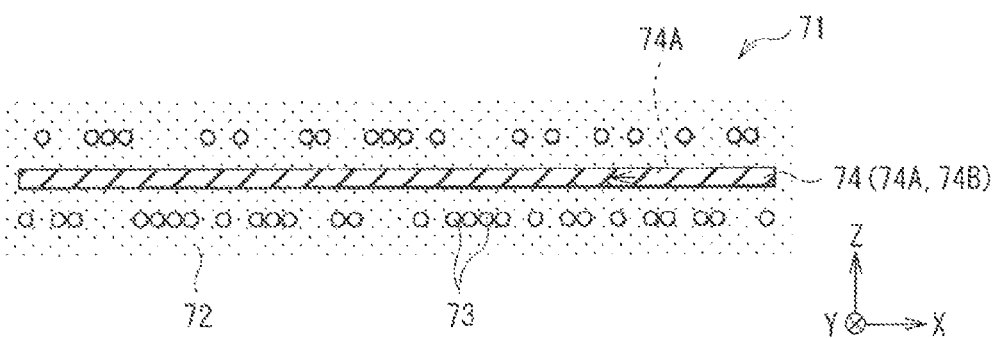

[ FIG. 16 ]
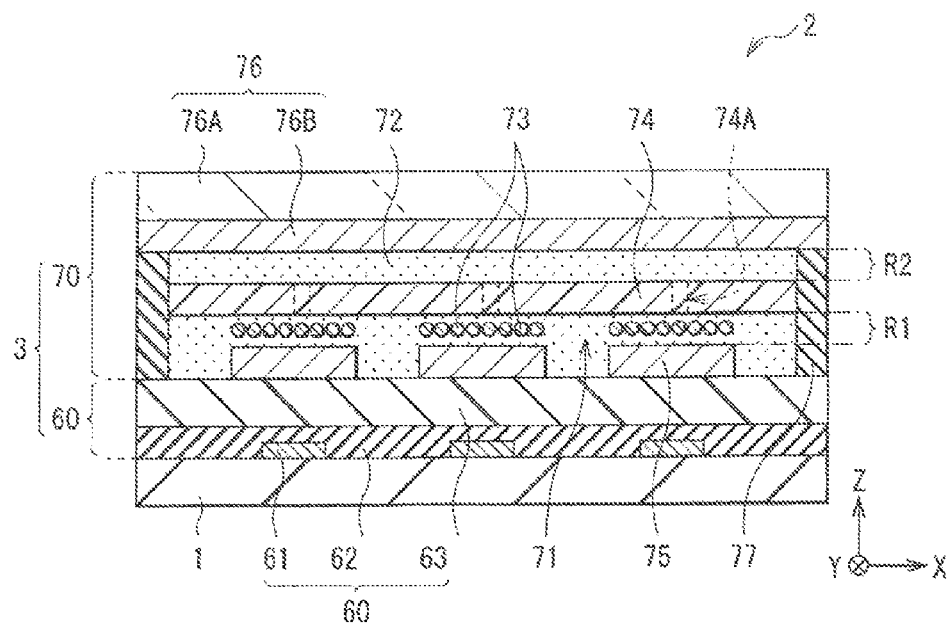
[ FIG. 17 ]
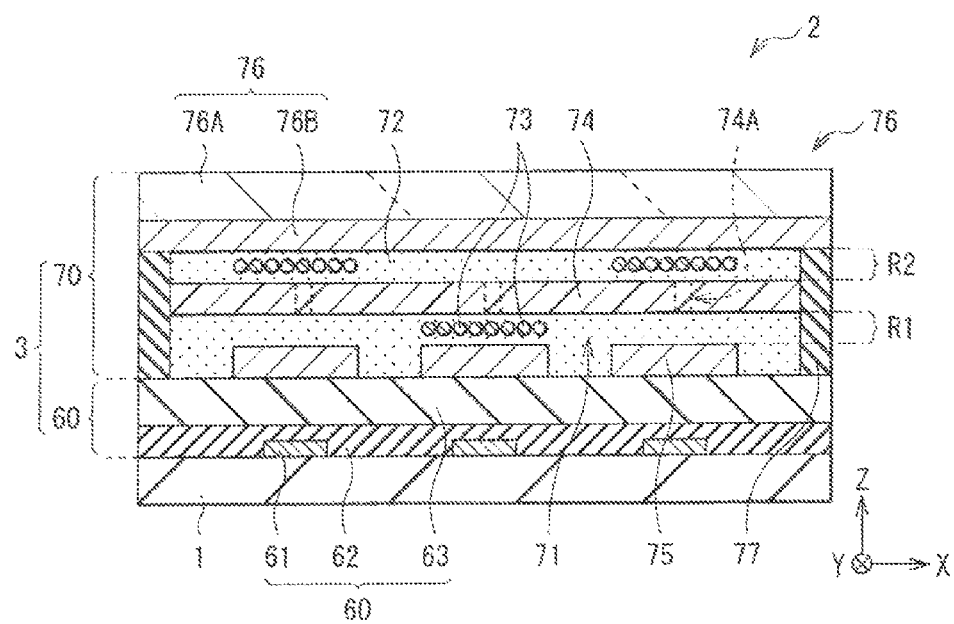

[ FIG. 18 ]
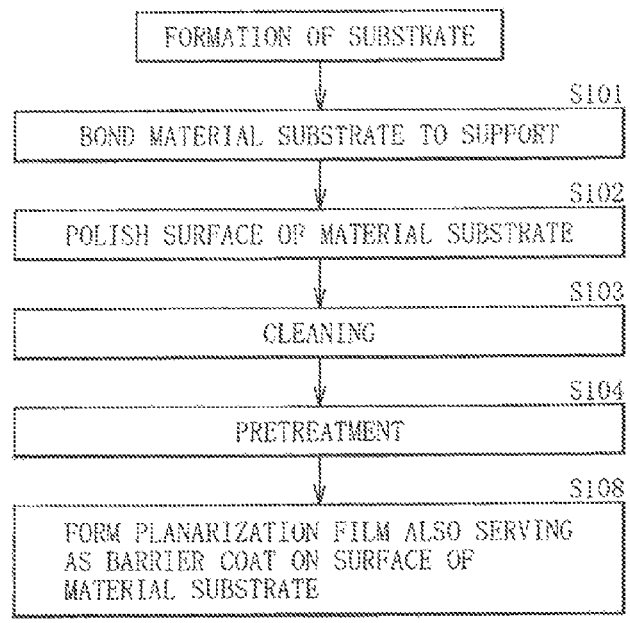
[ FIG. 19 ]
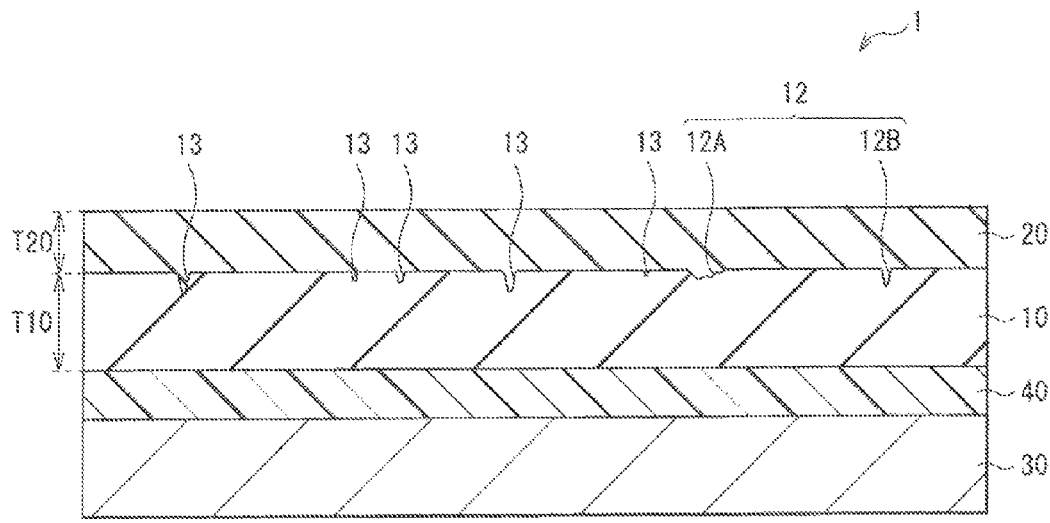

[FIG. 20]
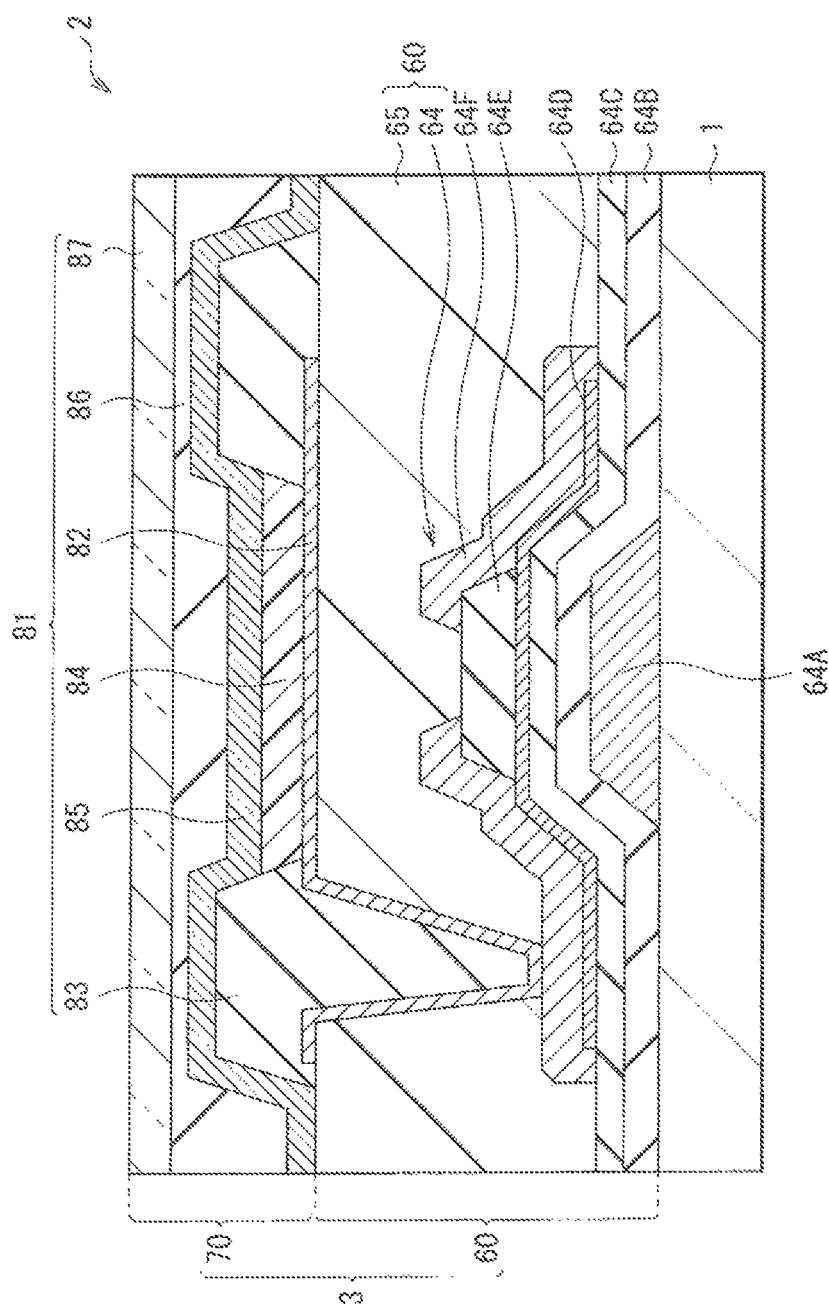

[ FIG. 21 ]
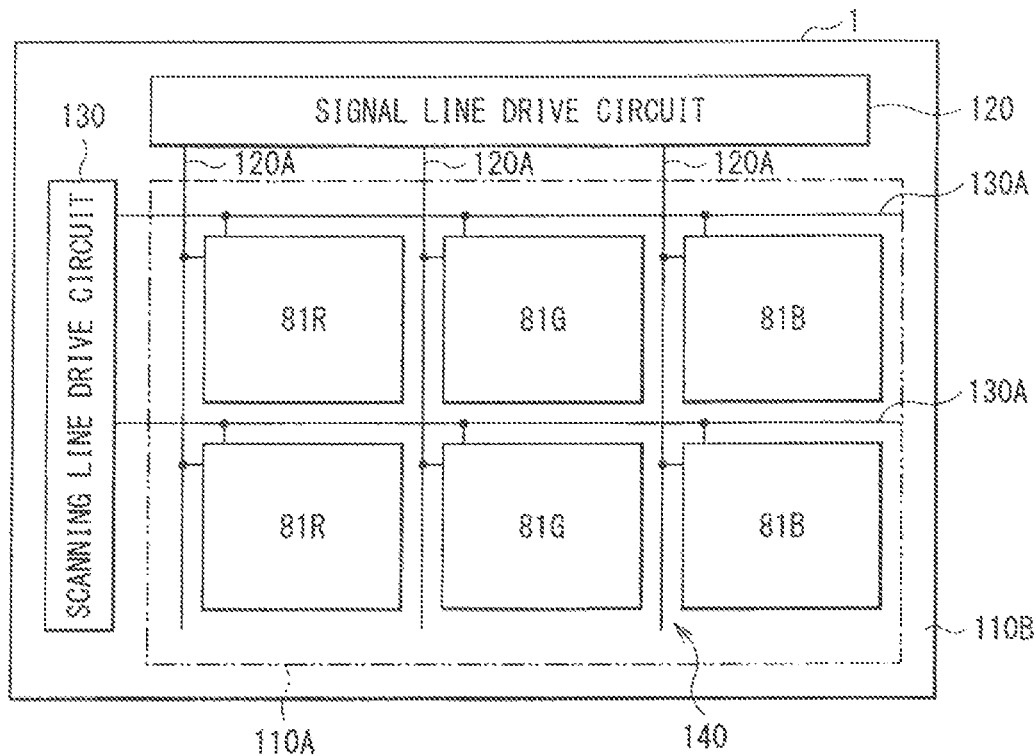
[ FIG. 22 ]
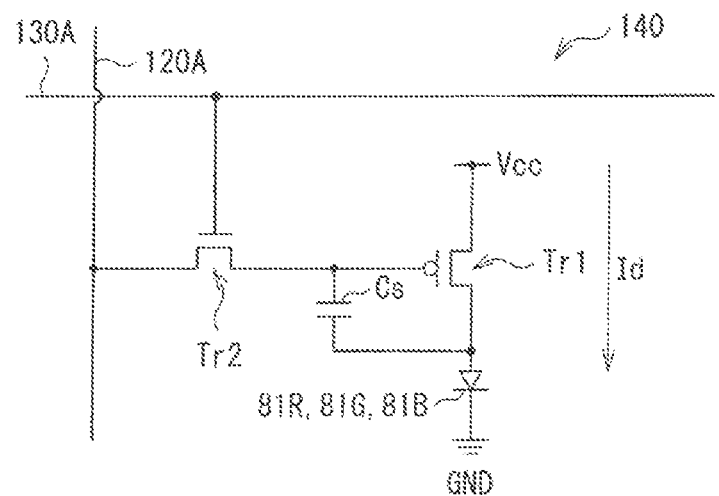

[ FIG. 23 ]
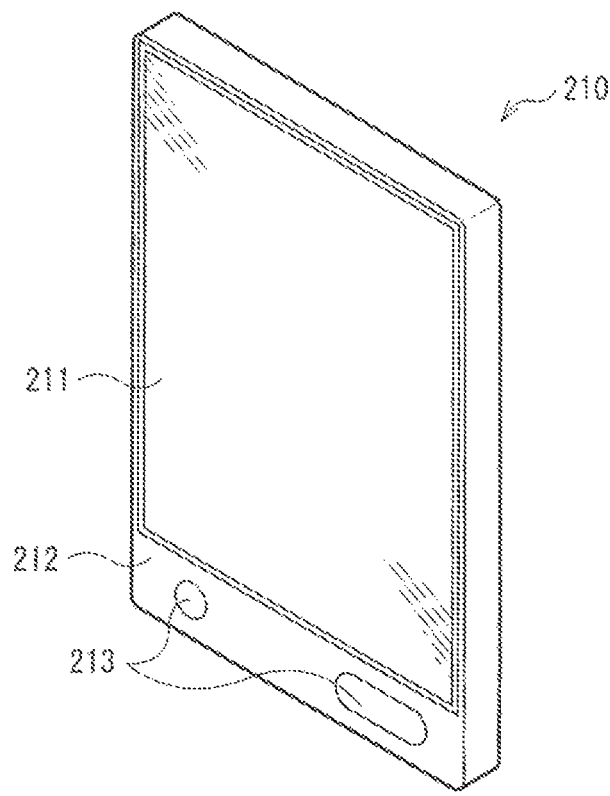
[ FIG. 24 ]
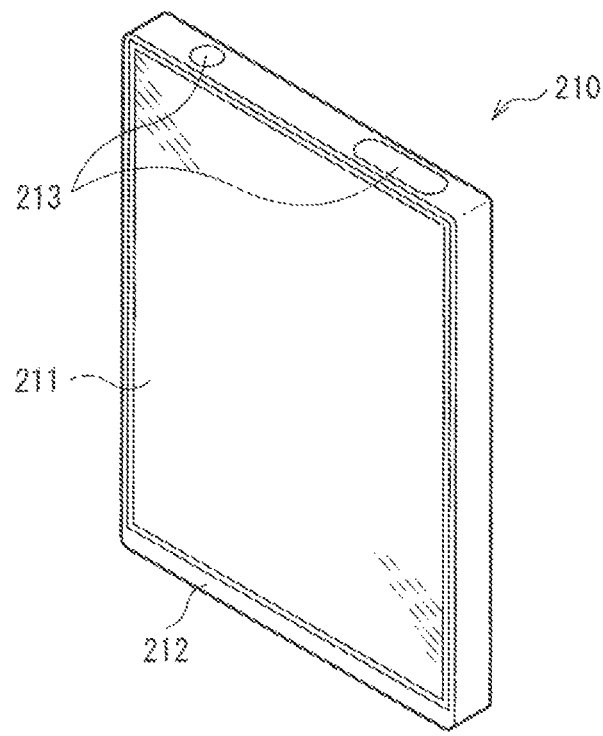

[ FIG. 25 ]
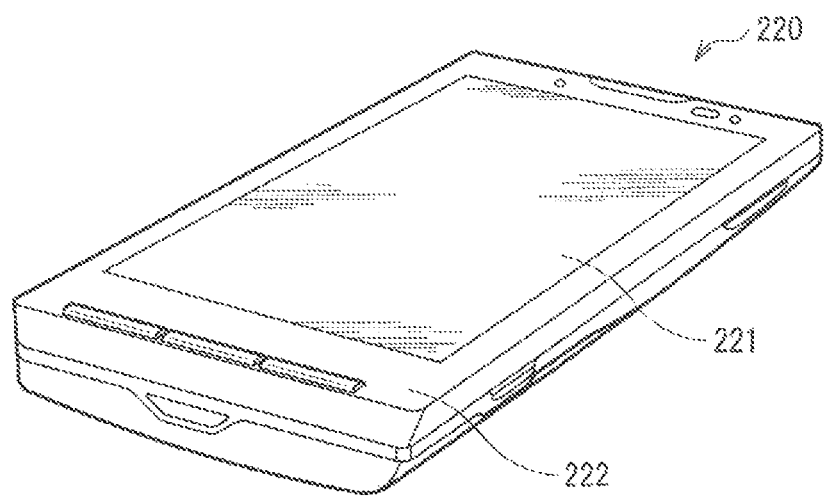
[ FIG. 26 ]
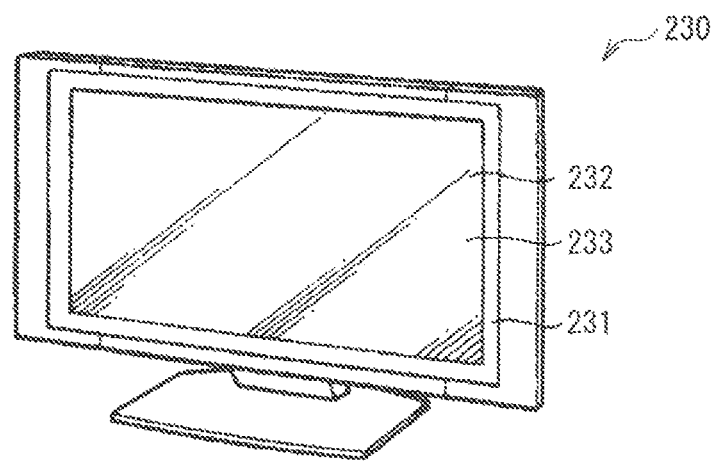

[ FIG. 27 ]
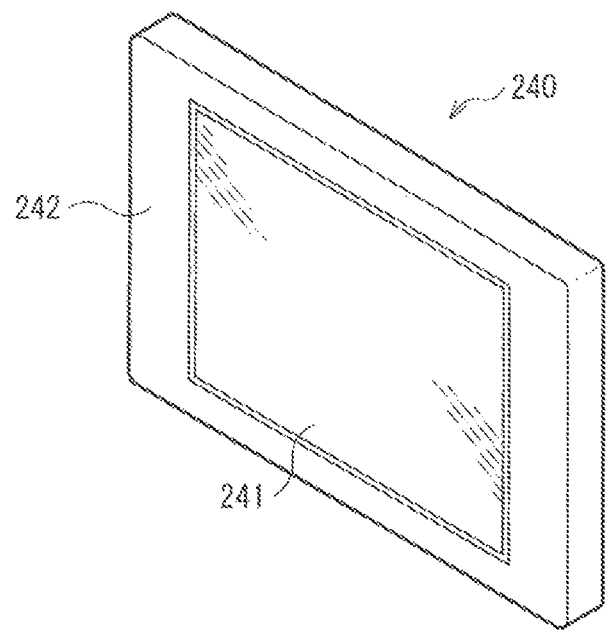
[ FIG. 28 ]
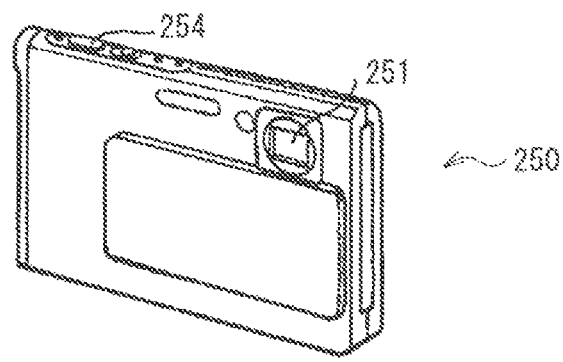
[ FIG. 29 ]
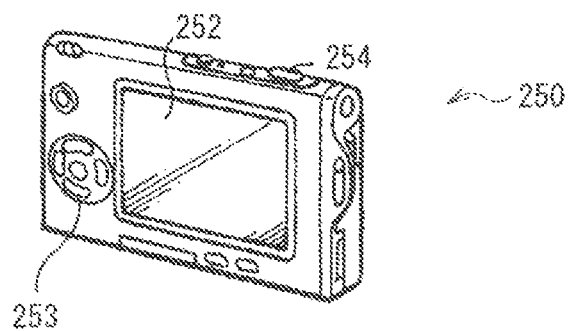

[FIG. 30]
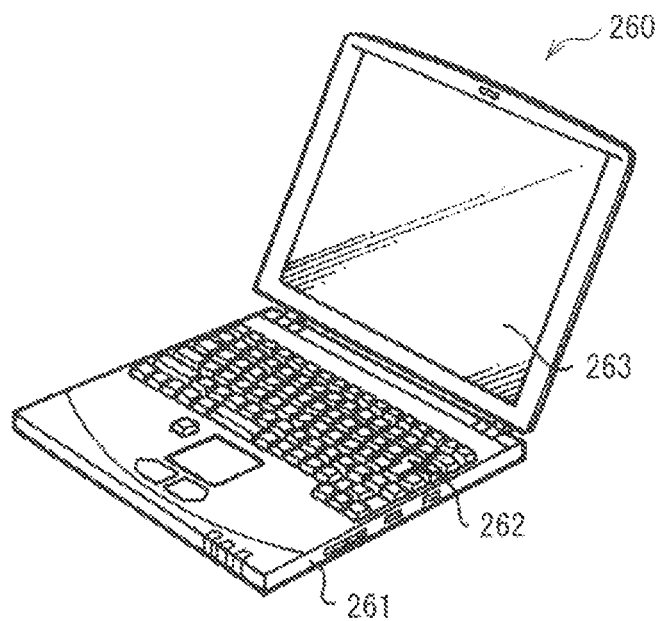
[FIG. 31]
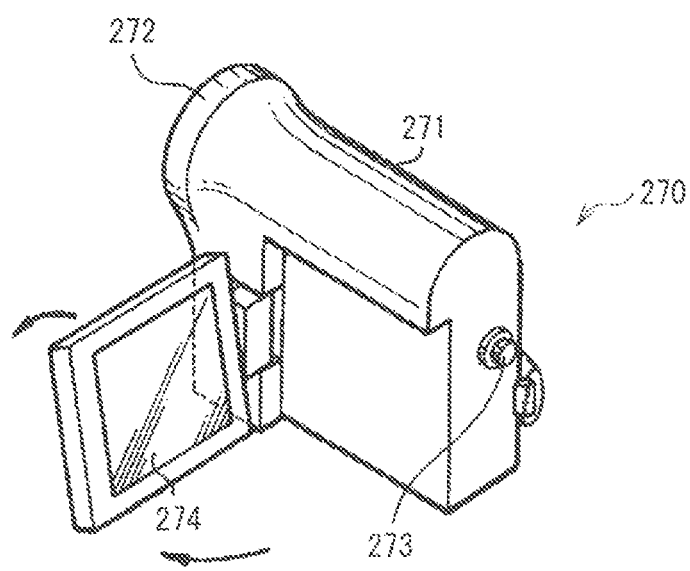

[FIG. 32]
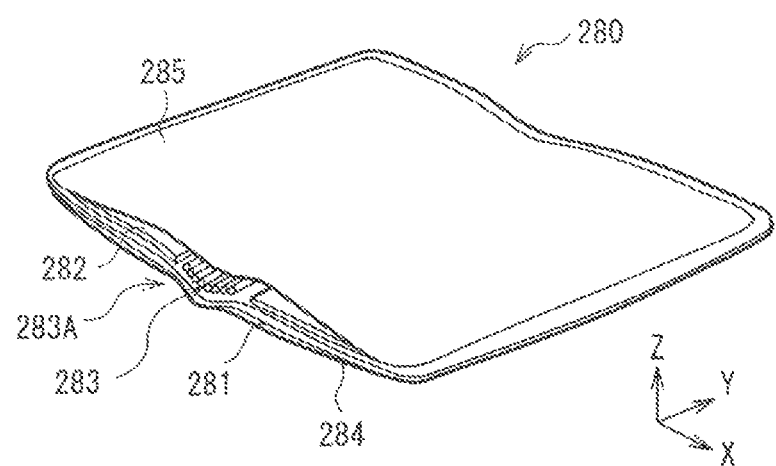
[FIG. 33]
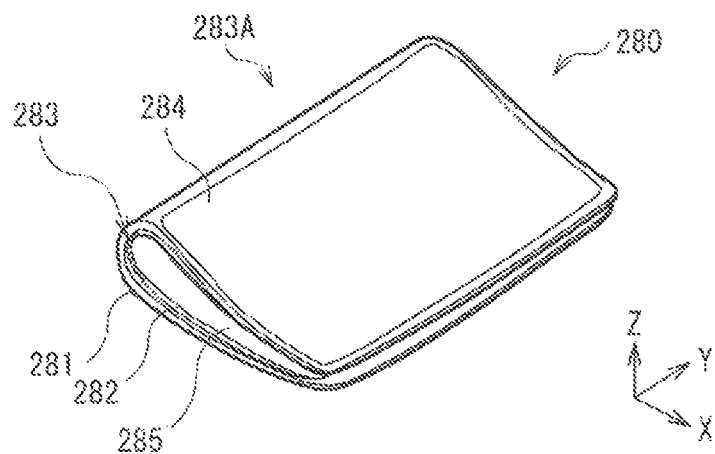

[FIG. 34]
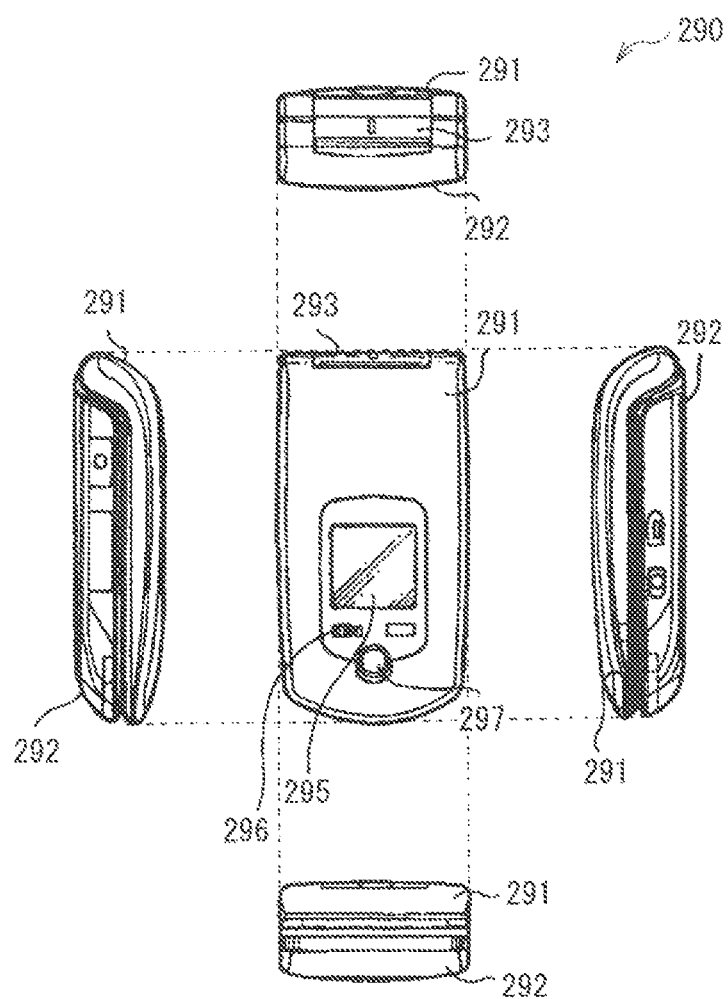

[ FIG. 35 ]
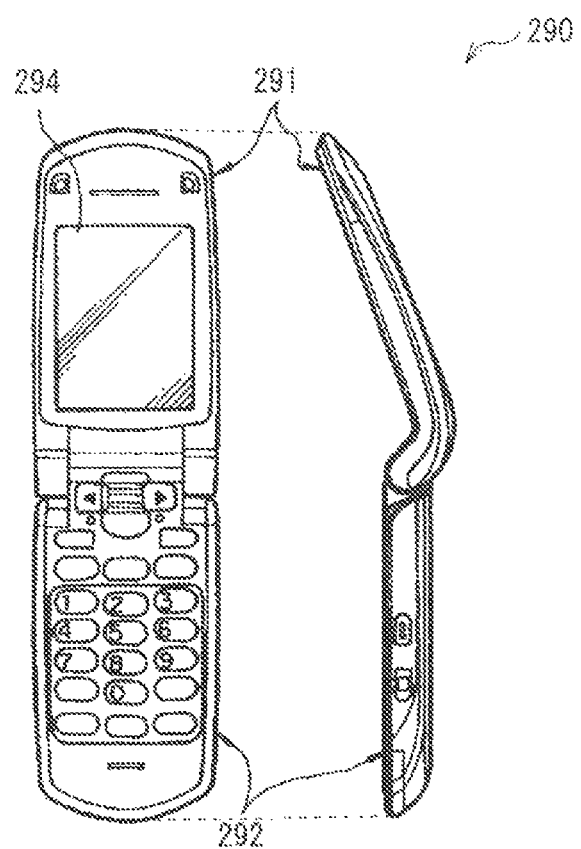

METHOD OF MANUFACTURING SUBSTRATE AND METHOD OF MANUFACTURING ELECTRONIC DEVICE

TECHNICAL FIELD

The technology relates to a method of manufacturing a substrate suitable specifically for formation of an electronic device having high flexibility, and a method of manufacturing an electronic device using the method of manufacturing the substrate.

BACKGROUND ART

In electronic devices such as display units, a function section including an electronic circuit, a display body, and other components is provided on a substrate surface. In a case where the substrate surface has detects such as a scratch and a dent, in order to reduce damage to the electronic circuit it is desirable to repair such defects before formation of the electronic circuit. For example, in Patent Literature 1, it is proposed that a restoration material is injected onto a substrate surface such as glass having defects such as a scratch and a dent and is hardened, and thereafter, the hardened restoration material is locally polished to planarize the substrate surface.

CITATION LIST

Patent Literature

Patent Literature 1: Japanese Unexamined Patent Application Publication No. 2010-15123

SUMMARY OF INVENTION

The substrate surface has not only recessed defects such as a scratch and a dent but also protruding defects such as protrusions, and a planarization technique that is able to cope with both the recessed defects and the protruding defects has not yet existed.

It is desirable to provide a method of manufacturing a substrate that allows for enhancement of smoothness of a substrate surface, and a method of manufacturing an electronic device using the method of manufacturing the substrate.

A method of manufacturing a substrate according to an embodiment of the disclosure includes: polishing a surface of a material substrate; and forming a planarization film on the surface of the material substrate after the polishing of the surface of the material substrate.

In the method of manufacturing the substrate according to the embodiment of the disclosure, when the surface of the material substrate is polished, protruding defects such as protrusions present on the surface of the material substrate are removed. Thereafter, when the planarization film is formed on the surface of the material substrate, recessed defects such as recessions present on the surface of the material substrate or flaws caused by the polishing are filled with the planarization film.

A method of manufacturing an electronic device according to an embodiment of the disclosure includes: forming a substrate; and forming a function section on the substrate, and the forming of the substrate is performed by the foregoing method of manufacturing the substrate according to the disclosure.

According to the method of manufacturing the substrate according to the embodiment of the disclosure or the method of manufacturing the electronic device according to the embodiment of the disclosure, the planarization film is formed on the surface of the material substrate after the polishing of the surface of the material substrate; therefore, the methods are able to cope with both the recessed defects and the protruding defects on a substrate surface, thereby allowing for enhancement of smoothness of the substrate surface.

BRIEF DESCRIPTION OF DRAWINGS

FIG. 1 is a diagram of a flow of a method of manufacturing a substrate according to an embodiment of the disclosure.

FIG. 2 is a sectional view of as example of a material substrate.

FIG. 3 is a sectional view of a state in which the material substrate illustrated in FIG. 2 is bonded to a support.

FIG. 4 is a sectional view of a process of polishing a surface of the material substrate illustrated in FIG. 3.

FIG. 5 is a sectional view of a process of forming a planarization film on the surface of the material substrate illustrated in FIG. 4.

FIG. 6 is a sectional view of a process of forming a barrier coat on a surface of the planarization film illustrated in FIG. 5.

FIG. 7 is a diagram of a flow of a method of manufacturing an electronic device (display unit) according to an embodiment of the disclosure.

FIG. 8 is a sectional view of a process of forming a TFT layer on the substrate illustrated in FIG. 6.

FIG. 9 is a sectional view of a process of forming a display body on the TFT layer.

FIG. 10 is a sectional view of a process of removing a substrate body including the material substrate and the planarization film from the support.

FIG. 11 is a cross-section view of a process of cutting the substrate body to form a module.

FIG. 12 is a perspective view of the process of cutting the substrate to form the module.

FIG. 13 is a sectional view of a process of removing the substrate body including the material substrate and the planarization film from the support.

FIG. 14 is a plan view of a configuration of an electrophoresis device as an example of the display body illustrated in FIG. 8.

FIG. 15 is a sectional view of a configuration of the electrophoresis device illustrated in FIG. 14.

FIG. 16 is a sectional view of a configuration of an electronic device (display unit) including the electrophoresis device illustrated in FIG. 14.

FIG. 17 is a sectional view for describing an action of the electronic device (display unit) illustrated in FIG. 16.

FIG. 18 is a diagram of a flow of a method of manufacturing an electronic device (display unit) according to Modification Example 1.

FIG. 19 is a sectional view of a process of forming a planarization film on a surface of a material substrate.

FIG. 20 is a sectional view of a configuration of an organic EL device as another example of the display body illustrated in FIG. 8 in an electronic device (display unit) according to Modification Example 2.

FIG. 21 is a diagram of an entire configuration of the electronic device (display unit) including the organic EL device illustrated in FIG. 20.

FIG. 22 is a diagram of an example of a pixel drive circuit illustrated in FIG. 21.

FIG. 23 is a perspective view of an appearance of Application Example 1 of the electronic device.

FIG. 24 is another perspective view of an appearance of Application Example 1.

FIG. 25 is a perspective view of an appearance of Application Example 2 of the electronic device.

FIG. 26 is a perspective view of an appearance of Application Example 3 of the electronic device.

FIG. 27 is a perspective view of an appearance of Application Example 4 of the electronic device.

FIG. 28 is a perspective view of an appearance viewed from front side of Application Example 5 of the electronic device.

FIG. 29 is a perspective view of an appearance viewed from back side of Application Example 5.

FIG. 30 is a perspective view of an appearance of Application Example 6 of the electronic device.

FIG. 31 is a perspective view of an appearance of Application Example 7 of the electronic device.

FIG. 32 is a perspective view of a state m which Application Example 8 of the electronic device is opened.

FIG. 33 is a perspective view of a state in which Application Example 8 is closed.

FIG. 34 is a diagram of a state in which Application Example 9 of the electronic device is closed.

FIG. 35 is a diagram of a stale in which Application Example 9 is opened.

MODE FOR CARRYING OUT THE INVENTION

Some embodiments of the disclosure will be described in detail below with reference to the accompanying drawings. It is to be noted that description will be given in the following order.
1. Embodiment (An example in which a resin film is formed as a planarization film and a harrier coat configured of an inorganic film is formed on a surface of the planarization film)
2. Modification Example 1 (An example in which, as a planarization film, an inorganic film that also serves as a barrier coat is formed)
3. Modification Example 2 (An example including an organic EL (Electroluminescence) device as a display body)
4. Application Examples
(Method of Manufacturing Substrate)

First, a method of manufacturing a substrate according to an embodiment of the disclosure will be described below with reference to FIGS. 1 to 6. The method of manufacturing a substrate 1 according to the embodiment involves using a material substrate 10 having flexibility such as a plastic film, and smoothing out recessed defects and protruding defects present on a surface of the material substrate 10 to form the substrate 1 having a highly smooth surface. The method of manufacturing the substrate 1 according to the embodiment includes: polishing the surface of the material substrate 10, and forming a planarization film 20 on the surface of the material substrate 10 after polishing the surface of the material substrate 10. The thus-obtained substrate 1 is used to manufacture an electronic device such as a display unit and a sensor.

(Process of Bonding Material Substrate 10 to Support 30)

The material substrate 10 may be made of a resin sheet (a plastic sheet) having flexibility, for example, as illustrated in FIG. 2. More specifically, a thickness of the material substrate 10 may be preferably, for example, 200 μm or less, and more preferably 50 μm or less. Non-limiting examples of the material of the material substrate 10 may include plastic sheets made of polyethylene terephthalate, polyethylene naphthalate, polyether sulfone, polyetherimide, polyether ether ketone, polyphenylene sulfide, polyarylate, polyimide, polyamide, polycarbonate, cellulose triacetate, polyolefin, polystyrene, polyethylene, polypropylene, polymethylmethacrylate, polyolefin, polyvinyl chloride, polyvinylidene chloride, an epoxy resin, a phenolic resin, a urea resin, a melamine resin, a silicone resin, and an acrylic resin.

Protruding defects 11 and recessed defects 12 are present on the surface of the material, substrate 10 as also illustrated in FIG. 2. Examples of the protruding defects 11 may include a high protrusion 11A with a height of 2 μm or more from a reference surface 10A and a low protrusion 11B with a height of 2 μm or less from the reference surface 10A. Examples of the recessed defects 12 may include a subsidence 12A recessed in a crater-like fashion from the reference surface 10A and a scratch 12B dug in a wedge shape from the reference surface 10A. It is to be noted that a depth from the reference surface 10A of the subsidence 12A may be, for example, 2.0 μm or less, and a depth from the reference surface 10A of the scratch 12B may be, for example, 10 μm or less.

Such a material substrate 10 is bonded to a support 30 with use of an adhesive layer 40, as illustrated in FIG. 3 (step S101 in FIG. 1) before a process of polishing. This makes it possible to perform the process of polishing and a process of forming a planarization film 20 in a state in which the material substrate 10 is bonded to the support 30 and to assure planarity of a back surface of the material substrate 10.

Bonding of the material substrate 10 to the support 30 may be performed as follows, for example. First, the adhesive layer 40 is formed on the support 30 or the material substrate 10 by coating through a printing method such as spin coating, die coating, or gravure coating, or by attaching as adhesive tape. Next, the material substrate 10 is bonded and fixed to the support 30 by a laminator.

For the support 30, a material having a melting point of 500° C. or more such as quartz glass, heat-resistant glass, metal, or ceramics may be preferably used. A linear expansion coefficient of the support 30 may be preferably, for example, 10 ppm/K or less. More preferably, the linear expansion coefficient of the support 30 may be from 0.1 ppm/K to 10 ppm/K both inclusive. A thickness T30 of the support 30 may be preferably, for example, 0.3 mm or more in terms of mechanical strength and handling. More preferably, the thickness T30 of the support 30 may be from 0.3 mm to 2.0 mm both inclusive.

As the adhesive layer 40, a general-purpose adhesive agent or a general-purpose adhesive tape may be used. This makes it possible to remove the material substrate 10 from the support 30 without performing a special process of weakening adhesive power and form, on the substrate 1, a function section 3 to be described later and any other component. More specifically, as the adhesive layer 40, an acrylic-based adhesive agent, a silicone-based adhesive agent a siloxane-based adhesive agent, a natural rubber-based adhesive agent, a synthetic rubber-based adhesive agent, or any other adhesive agent may be used.

(Process of Polishing Surface of Material Substrate 10)

After the material substrate 10 is fixed to the support 30, the surface of the material substrate 10 is polished with use of a polishing member P as illustrated in FIG. 4 (step S102 in FIG. 1). Thus, the protruding defects 11 present on the surface of the material substrate 10 are scraped off.

The polishing method used here may be mechanical polishing or polishing using, for example but not limited to, an abrasive (slurry) having an appropriately adjusted PH for enhancement of polishing efficiency. More specifically, as the polishing method, techniques such as CMP (Chemical Mechanical Polishing), tape polishing, and roll polishing may be used.

In this polishing process, an entirety of the surface of the material substrate 10 may be preferably polished. When a part of the surface of the material substrate 10 is locally polished, the protruding defects 11 may remain in a region where polishing has not been performed. The remaining protruding defects 11 may not be covered with the planarization film 20 to be formed in a later process, depending on the heights thereof, thereby resulting in a decline in surface smoothness of the substrate 1.

In this polishing process, it may be preferable to perform polishing until the heights of the protruding defects 11 are reduced to a value equal to or smaller than the thickness of the planarization film 20 to be formed in the later process, for example, to 1 μm or less. When the heights of the protruding defects 11 are 1 μm or less, it is possible to cover the protruding defects 11 with the planarization film 20 to be formed in the later process.

In the polishing process, formation of polishing flaws 13 on the surface of the material substrate 10 is acceptable. The polishing flaws 13 cause an increase in surface area, which increases contact area between the material substrate 10 and the planarization film 20 and causes an anchor effect, thereby expecting as effect of improving adhesion. Depths D13 of the polishing flaws 13 may be preferably equal to or smaller than the thickness of the planarization film 20 to be formed in the later process, for example, 3 μm or less, and more preferably 1 μm or less. As long as the polishing flaws 13 have such a depth D13, planarization is made possible by the planarization film 20 to be formed in the later process.

(Cleaning)

After the surface of the material substrate 10 is polished, the surface of the material substrate 10 is cleaned in preparation for formation of the planarization film 20 in a subsequent process (step S103 in FIG. 1). For example, polishing swarf and the abrasive (slurry) are removed by the cleaning process to obtain a clean surface. As the cleaning method, water cleaning or organic cleaning may be executed, and in addition, ultrasonic cleaning or any other cleaning may be executed. UV (ultraviolet) cleaning or ozone cleaning may be further performed.

(Pretreatment)

After the surface of the material substrate 10 is cleaned, pretreatment is performed before forming the planarization film 20 (step S104 in FIG. 1). In the pretreatment, UV treatment, plasma treatment, coating with a silane coupling agent, or any other pretreatment for improvement in adhesion of the planarization film 20 may be performed.

(Process of Forming Planarization Film 20 on Surface of Material Substrate 10)

After the pretreatment is completed, the planarization film 20 is formed or the surface of the material substrate 10 as illustrated m FIG. 5 (step S105 in FIG. 1). Thus, the recessed defects 12 present on the surface of the material substrate 10 and the polishing flaws 13 caused by the polishing process are filled with the planarization film 20. Concurrently with this, the protruding defects 11 remaining after polishing are covered with the planarization film 20. Thus, the smooth surface of the planarization film 20 is formed.

The planarization film 20 may be a resin film or an inorganic film. Non-limiting examples of the resin film may include an acrylic resin film and a polyimide-based resin film. Non-limiting examples of the inorganic film may include a SiOx film, a SiNx film, a SiON film, and an $Al_2O_3$ film. Moreover, the planarization film 20 may be a hybrid film of a resin film and an inorganic film. The planarization film 20 may be made of TEOS (tetraethyl orthosilicate), and even if the recessed defects 12 are present on the surface of the material substrate 10, it is possible to easily smooth the surface of the planarization film 20.

As a technique of forming the planarization film 20, in a case of the resin film, methods such as slit coating, screen printing, gravure coating, spin coating, and spray coating may be used. In a case of the inorganic film, in addition to the foregoing methods, CVD (Chemical Vapor Deposition), ALD (Atomic Layer Deposition), a sputtering method, and any other method may be used.

In a case where there is a great difference in thermal behavior between the planarization film 20 and the material substrate 10, strain stress is accumulated by a thermal process in a manufacturing process. For example, in a case where a difference in thermal expansion coefficient is large, substrate warpage or film peeling may occur in a heating process, and in a case where a difference in heat shrinkage is large, substrate warpage or film peeling may occur when the temperature retorts to a room temperature after the beating process. For this reason, the planarization film 20 may be preferably made of a material having same or substantially same thermal behavior such as the thermal expansion coefficient and heat shrinkage. Moreover, the planarization film 20 may be preferably made of a material having a high affinity in, for example but not limited to, a chemical composition and a functional group for the material substrate 10. In addition, the planarization film 20 may preferably have heat resistance to a temperature during formation of the function section 3 in a later process.

The thickness T20 of the planarization film 20 may be preferably smaller than the thickness T10 of the material substrate 10. In a case where the material substrate 10 is thinner than the planarization film 20, the protruding defects 11 remaining after polishing of the surface of the material substrate 10 may not be covered. Moreover, when the heat shrinkage of the planarization film 20 is large, film shrinkage of the planarization film 20 is increased by a heating process during the formation of the function section in the later process to cause warpage of the substrate 1. Further, the larger the thickness T20 is, the more an influence thereof is increased. Accordingly, the thickness T20 of the planarization film 20 may be preferably, for example, equal to or smaller than one-fifth of the thickness T10 of the material substrate 10, more preferably equal to or smaller than one-seventh, and still more preferably equal to or smaller than one-tenth.

(Post-Baking)

After the planarization film 20 is formed on the surface of the material substrate 10, sintering (post-baking) of the planarization film 20 is performed with, for example but not limited to, an oven or an IR (infrared) furnace (step S106 in FIG. 1). A temperature when this process is performed may the preferably equal to or lower than heat resistant temperatures of materials of respective layers of a stacking structure including the material substrate 10, the planarization film 20, the support 30, and the adhesive layer 40. Moreover, a baking temperature when this process is performed may be preferably a temperature at which a resin film is not decomposed in a later process. Further, heating may be preferably performed sufficiently until gas is not released from the resin film or any other film to the utmost.

(Forming Barrier Coat)

After post-baking is finished, a barrier coat 50 is formed on a surface of the planarization film 20 as illustrated, in FIG. 6 (step S107 in FIG. 1). The barrier coat 50 may preferably have, for example, a thickness of several tens of nm to several hundreds of nm both inclusive, and may be preferably configured of an inorganic film such as a SiOx film, a SiNx film, a SiON film, an $Al_2O_3$ film, and a TEOS film. Thus, the substrate 1 is completed.

(Method of Manufacturing Electronic Device (Display Unit))

With reference to FIGS. 7 to 13, a method of manufacturing an electronic device (a display unit) according to the embodiment will be described below. A method of manufacturing an electronic device 2 according to the embodiment includes: forming the function section 3 having a desired function such as displaying an image on the substrate 1 or sensing after forming the substrate 1 by the foregoing method of manufacturing the substrate 1; and performing cutting and module formation.

(Process of Forming Function Section 3)

First, a TFT layer 60 is formed on a surface of foe barrier coat 50 of the substrate 1 as illustrated in FIG. 8 (step S201 in FIG. 7).

Next, a display body 70 is formed or the TFT layer 60 as illustrated in FIG. 9 (step S202 in FIG. 7). Thus, the function section 3 that displays an image is formed on the substrate 1.

(Process of Performing Cutting and Module Formation)

After the function section 3 is formed on the substrate as indicated by an arrow R1 in FIG. 10, a substrate body 4 including the material substrate 10, the planarization film 20, and the barrier coat 50 is removed from the support 30 and the adhesive layer 40 (step S301 in FIG. 7).

Next, as illustrated in FIG. 11, the substrate body 4 and the function section 3 are cut along a cutting line CL into a predetermined shape with predetermined dimensions, and are coupled to a flexible wiring substrate 5 to form a module 6 (step S302 in FIG. 7). Finally, the module 6 is incorporated in an enclosure (not illustrated) to complete the electronic device 2.

Alternatively, the substrate body 4 may be removed from the support 30 after performing cutting and formation of the module 6. In this case, for example, after the function section 3 is formed on the substrate 1, as illustrated in FIG. 12, the substrate 1 and the function section 3 are cut along the cutting line CL into the predetermined shape with the predetermined dimensions, and are coupled to the flexible wiring substrate 5 to form the module 6 (step S303) in FIG. 7).

Next, as indicated by an mow R2 in FIG. 13, in the thus-obtained module 6, the substrate body 4 including the material substrate 10, the planarization film 20, and the barrier coat 30 is removed from the support 30 and the adhesive layer 40 (step S304 in FIG. 7). Finally, the module 6 is incorporated in the enclosure (not illustrated) to complete the electronic device 2.

(Example in which Electrophoresis Device is Foraged as Display Body 70)

With reference, to FIGS. 14 to 17, description will be given of an example in which an electrophoresis device is formed as the display body 70 and an electronic paper display is manufactured as the electronic device 2.

FIG. 14 illustrates a planar configuration of an electrophoresis device 71 as an example of the display body 70, and FIG. 15 illustrates a sectional configuration of the electrophoresis device 71. The electrophoresis device 71 is configured to provide contrast with use of an electrophoresis phenomenon and may be applied to, for example, various electronic devices such as a display unit. The electrophoresis device 71 includes migrating particles 73 (first particles) and a porous layer 74 having pores 74A in an insulating liquid 72. It is to be noted that FIGS. 14 and 15 schematically illustrate the configuration of the electrophoresis device 71, and its dimensions and its shape may be different from actual dimensions and an actual shape.

The insulating liquid 72 may be made of, for example, an organic solvent such as paraffin or isoparaffin. As the insulating liquid 72, one kind of organic solvent or a plurality of kinds of organic solvents may be used. Viscosity and a refractive index of the insulating liquid 72 may be preferably as low as possible. When the viscosity of the insulating liquid 72 is low, mobility (response speed) of the migrating particles 73 is improved. Moreover, energy (power consumption) necessary for movement of the migrating particles 73 is reduced accordingly. When the refractive index of the insulating liquid 72 is low, a difference in refractive index between the insulating liquid 72 and the porous layer 74 is increased to increase reflectivity of the porous layer 74.

For example, a colorant, a charge control agent, a dispersion stabilizer, a viscosity modifier, a surfactant a resin, or any other additive may be added to the insulating liquid 72.

The migrating particles 73 dispersed in the insulating liquid 72 are one or two or more charged particles, and such charged migrating particles 73 move through the pores 74A according to an electric field. The migrating particles 73 have any given optical reflection property (light reflectivity), and a difference in light reflectivity between the migrating particles 73 and the porous layer 74 provides contrast. For example, display in a bright state may be performed by the migrating particles 73, and display in a dark state may be performed by the porous layer 74, and alternatively, display in the dark state may be performed by the migrating particles 73 and display in the bright state may be performed by the porous layer 74.

When the electrophoresis device 71 is viewed from outside, the migrating particles 73 may be visually recognized, for example, as white or a color close to white in a case where display in the bright state is performed by the migrating particles 73, and the migrating particles 73 may be visually recognized, for example, as black or a color close to black in a case where display in the dark state is performed by the migrating particles 73. The color of such migrating particles 73 is not specifically limited, as long as it is possible to provide contrast.

The migrating particles 73 may be configured of, for example, particles (powder) of an organic pigment, an inorganic pigment, a dye, a carbon material, a metal material a metal oxide, glass, or a polymer material (a resin). For the migrating particles 73, one of these materials or two or more of these materials may be used. The migrating particles 73 may be configured of pulverized particles, capsule particles, or any other particles of a resin solid including the foregoing particles. It is to be noted that a material corresponding to the foregoing carbon material, the foregoing metal material, the foregoing metal oxide, the foregoing glass, or the foregoing polymer material is excluded from a material corresponding to the organic pigment, the inorganic pigment, or the dye. The particle diameter of the migrating particles 73 may be, for example, 30 nm to 300 nm both inclusive.

Examples of the foregoing organic pigment may include ago-based pigments, metal-complex azo-based pigments, polycondensation azo-based pigments, flavanthrone-based pigments, benzimidazolone-based pigments, phthalocyanine-based pigments, quinacridone-based pigments, anthraquinone-based pigments, perylene-based pigments, perinone-based pigments, anthrapyridine-based pigments, pyranthrone-based pigments, dioxazine-based pigments, thioindigo-based pigments, isoindolinone-based pigments, quinophthalone-based pigments, and indanthrene-based pigments. Examples of the inorganic pigments may include zinc white, antimony white, iron black, titanium boride, red iron oxide, Mapico Yellow; minium, cadmium yellow, zinc sulfide, lithopone, barium sulfide, cadmium selenide, calcium carbonate, barium sulfate, lead chromate, lead sulfate, barium carbonate, white lead, and alumina white. Examples of the dyes may include nigrosine-based dyes, azo-based dyes, phthalocyanine-based dyes, quinophthalone-based dyes, anthraquinone-based dyes, and methine-based dyes. Examples of the carbon material may include carbon black. Examples of the metal material may include gold, silver, and copper. Examples of the metal oxide may include titanium oxide, zinc oxide, zirconium oxide, barium titanate, potassium titanate, copper-chromium oxide, copper-manganese oxide, copper-iron-manganese oxide, copper-chromium-manganese oxide, and copper-iron-chromium oxide. Examples of the polymer material may include a polymer compound into which a functional group having a light absorption region in a visible light region is introduced. As long as the polymer compound has the light absorption region in the visible light region, the kind of the polymer compound is not specifically limited.

For example, a specific material of the migrating particles 73 may be selected, based on a role that the migrating particles 73 play in providing contrast. In a case where display in the bright state is performed by the migrating particles 73, for example, a metal oxide such as titanium oxide, zinc oxide, zirconium oxide, barium titanate, or potassium titanate may be used for the migrating particles 73. In a case where display in the dark, state is performed by the migrating particles 73, for example, a carbon material, such as carbon black, a metal oxide such as copper-chromium oxide, copper-manganese oxide, copper-iron-manganese oxide, copper-chromium-manganese oxide, and copper-iron-chromium oxide may be used for the migrating particles 73. In particular, the carbon material may be preferably used for the migrating particles 73. The migrating particles 73 made of the carbon material exhibit high chemical stability, high mobility, and high light absorption.

The content (concentration) of the migrating particles 73 in the insulating liquid 72 may be, for example, but not specifically limited to, within a range of 0.1 wt % to 10 wt % both inclusive. In this concentration range, a shielding property and mobility of the migrating particles 73 are secured. More specifically, when the content of the migrating particles 73 is smaller than 0.1 wt %, it is difficult for the migrating particles 73 to shield (obscure) the porous layer 74, and there is a possibility that it is difficult to provide sufficient contrast. When the content of the migrating particles 10 is larger than 10 wt %, dispersibility of the migrating particles 73 decreases, and accordingly, the migrating particles 73 become difficult to migrate, and may be thereby agglomerated.

It may be preferable that the migrating particles 73 be easily dispersed and charged in the insulating liquid 72 over a long time, and become difficult to be absorbed by the porous layer 74. For this reason, for example, a dispersant may be added to the insulating liquid 72. Moreover, both the dispersant and a charge control agent may be used.

This dispersant or this charge control agent may have, for example, one or both of a positive charge and a negative charge, and is used to increase a charge amount in the insulating liquid 72 and to disperse the migrating particles 73 by electrostatic repulsion. Examples of such a dispersant may include a Solsperce series available from Lubrizol corp., a BYK series or an Ami-Terra series available from BYK-Chemic, and a Span series manufactured available from TCI Americas Inc.

In order to improve dispersibility of the migrating particles 73, surface treatment may be performed on the migrating particles 73. Examples of the surface treatment may include rosin treatment, surfactant treatment, pigment derivative treatment, coupling agent treatment, graft polymerization treatment, and microencapsulation treatment. In particular, performing the graft polymerization treatment, the microencapsulation treatment, or a combination thereof makes it possible to maintain dispersion stability of the migrating particles 10 for a long time.

For such surface treatment, for example, a material (a absorbent material) having a functional group that is absorbable by surfaces of the migrating particles 73 and a polymerizable functional group may be used. The absorbable functional group is determined depending on a formation material of the migrating particles 73. For example, in a case where the migrating particles 73 are made of a carbon material such as carbon black, it is possible to absorb an aniline derivative such as 4-vinyl aniline, and in a case where the migrating particles 73 are made of a metal oxide, it is possible to absorb an organosilane derivative such as 3-(trimethoxy cyril) propyl methacrylate. Examples of the polymerizable functional group may include a vinyl group, an acrylic group, and a methacryl group.

A polymerizable function group may be introduced into and grafted to the surfaces of the migrating particles 73 to perform surface treatment (a graft material). The graft material may include, for example, a polymerizable functional group and a dispersion functional group. The dispersion functional group allows the migrating particles 73 to be dispersed in the insulating liquid 72, thereby maintaining dispersibility by steric hindrance thereof. For example, in a case where the insulating liquid 72 is paraffin, a branched alkyl group or any other group may be used as the dispersion functional group. Examples of the polymerizable functional group may include a vinyl group, an acrylic group, and a methacryl group. For example, a polymerization initiator such as azobisisobutyronitrile (AIBN) may be used for polymerization and grafting of the graft material.

A method of dispersing the foregoing migrating particles 73 in the insulating liquid 72 is described in detail in books such as "Dispersion Technique of Ultrafine Particles and Evaluation Thereof: Surface Treatment, Pulverizing, and Dispersion Stabilization in Gas, Liquid, and Polymer" published by Science & technology Co., Ltd.

The porous layer 74 is able to shield the migrating particles 73, and includes a fibrous structure 74B and non-migrating particles 74C (second particles) held by the fibrous structure 74B. The porous layer 74 is a three-dimensional steric structure (an irregular network, structure such as a nonwoven fabric) formed of the fibrous structure 74B, and includes a plurality of openings (pores 74A). When the three-dimensional steric structure of the porous layer 74 is configured of the fibrous structure 74B, light (outside light) is diffused (multiply scattered) to cause an increase in reflectivity of the porous layer 74. This makes it possible to obtain high reflectivity even if the thickness of the porous layer 74 is small and tins makes it possible to improve contrast of the electrophoresis device 71 and reduce energy necessary for movement of the migrating, particles 73.

Moreover, an average pore diameter of the pores 74A is increased, and a large number of the pores 74A are provided in the porous layer 74. Accordingly, the migrating particles 73 easily move through the pores 74A to improve response speed, and energy necessary for movement of the migrating particles 73 is further reduced. A thickness of such a porous layer 74 may be, for example, 5 µm to 100 µm both inclusive.

The fibrous structure 74B is a fibrous material having a sufficient length with respect to a fiber diameter (diameter). For example, a plurality of fibrous structures 21 may be gathered in a randomly overlapped manner to form the porous layer 74. One fibrous structure 74B may be randomly tangled to form the porous layer 74. Alternatively, the porous layer 74 configured of one fibrous structure 74B and the porous layer 74 configured of a plurality of fibrous structures 74B may be mixed.

The fibrous structure 74B may be made of, for example, a polymer material, or an inorganic material. Examples of the polymer material may include nylon, polylactic acid, polyamide, polyimide, polyethylene terephthalate, polyacrylonitrile, polyethylene oxide, polyvinyl carbazole, polyvinyl chloride, polyurethane, polystyrene, polyvinyl alcohol, polysulfone, polyvinylpyrrolidone, polyvinylidene fluoride, polyhexafluoropropylene, cellulose acetate, collagen, gelatin, chitosan, and copolymers thereof. Examples of the inorganic material may include titanium, oxide. The polymer material may be preferably used for the fibrous structure 74B. This is because the polymer material has low reactivity with respect to, for example but not limited to, light and is chemically stable. In other words, using the polymer material makes it possible to prevent unintentional decomposition reaction of the fibrous structure 74B. In a case where the fibrous structure 74B is made of a highly reactive material, a surface of the fibrous structure 74B may be preferably covered with any given protective layer.

The fibrous structure 74B may extend, for example, linearly. The fibrous structure 74B may have any shape, for example, may be curled, or may be bent at some point. Alternatively, the fibrous structure 74B may be branched at some point.

An average fiber diameter of the fibrous structure 74B may be, for example, 50 nm to 2000 nm both inclusive, but may be out of the foregoing range. When the average fiber diameter is reduced, light is easily diffused, and the diameter of the pore 74A is increased. The fiber diameter of the fibrous structure 74B is so determined as to allow the fibrous structure 74B to hold the non-migrating particles 74C. The average fiber diameter may be measured by, for example, microscopic observation with use of a scanning electron microscope or any other microscope. The fibrous structure 74B has any given average length. The fibrous structure 74B may be formed by, for example, a phase separation method, a phase inversion method, an electrostatic (electric field) spinning method, a melt spinning method, a wet spinning method, a dry spinning method, a gel spinning method, a sol-gel method, or a spray coating method. Using such a melted makes it possible to easily and stably form the fibrous structure 74B with a efficient length with respect to the fiber diameter.

The fibrous structure 74B may be preferably configured of nanofibers. In this case, the nanofibers have a fiber diameter of 1 nm to 1000 nm both inclusive and a length that is 100 or more times as large as the fiber diameter. Using such nanofibers as the fibrous structure 74B makes it possible to easily diffuse light and further improve light reflectivity of the porous layer 74. In other words, this makes it possible to improve contrast of the electrophoresis device 71. Moreover, in the fibrous structure 74B made of nanofibers, the ratio of the pores 74A in a unit volume is increased, and the migrating particles 73 easily move through the pores 74A accordingly. This makes it possible to reduce energy necessary for movement of the migrating particles 73. The fibrous structure 74B made of nanofibers may be preferably formed by an electrostatic spinning method. Using the electrostatic spinning method makes it possible to easily and stably form the fibrous structure 74B with a small fiber diameter.

The fibrous structure 74B having light reflectivity different from light reflectivity of the migrating particles 73 may be preferably used. This allows contrast by a difference in light reflectivity between the porous layer 74 and the migrating particles 73 to be easily formed. The fibrous structure 74B exhibiting light transparency (colorless and transparent) may be used in the insulating liquid 72.

The pores 74A are formed by a plurality of fibrous structures 74B overlapping one another or one tangled fibrous structure 74B. The pores 74A may preferably have a largest possible average pore diameter so as to allow the migrating particles 73 to easily move through the pores 74A. The average pore diameter of the pore 74A may be, for example, 0.1 µm so 10 µm both inclusive.

The non-migrating particles 74C are fixed in the fibrous structure 74B, and have light reflectivity different from light reflectivity of the migrating particles 73. The non-migrating particles 74C may be made of a material similar to that of the foregoing migrating particles 73. More specifically, in a case where display in the bright state is performed by the non-migrating particles 74C (the porous layer 74), it as possible to use the material of the foregoing migrating particles 73 used in a case where display in the bright state is performed by the migrating particles 73, and in a case where display m the dark state is performed by the non-migrating particles 74C, it is possible to use the material of the foregoing migrating particles 73 used in a case where display in the dark stale is performed by the migrating particles 73. When display in the bright state is performed by the porous layer 74, the non-migrating particles 74C may be preferably made of a metal oxide. This makes it possible to obtain high chemical stability, high fixity, and high light reflectivity. In particular, the non-migrating particles 74C may be preferably made of a metal oxide having a high refractive index, for example, rutile titanium oxide. The constituent materials of the non-migrating particles 74C and foe migrating particles 73 may be the same as or different from each other. The non-migrating particles 74C may be completely embedded inside the fibrous structure 74B, or may be exposed in part from the fibrous structure 74C. A color visually recognized when display in the bright state or display in the dark state is performed by the non-migrating particles 74C is similar to that in the description of the foregoing migrating particles 73.

Such a porous layer 74 may be formed by, for example, the following method. First, for example, a spinning solution is prepared by dissolving the constituent material such as a polymer material of the fibrous structure 74B in, for example but not limited to, an organic solvent. Next, the non-migrating particles 74C are added to this spinning solution, and then the spinning solution is sufficiently stirred to disperse the non-migrating panicles 74C. Finally, spinning is performed with use of the spinning solution by, for example, an electrostatic spinning method to fix the non-migrating particles 74C to the fibrous structure 74B, thereby forming the porous layer 74. The porous layer 74 may be formed by performing hole drilling on a polymer film with use of a laser to form the pores 74A, and a fabric woven from, for example but not limited to, synthetic fibers, an open-cell foam porous polymer, or any other material may be used for the porous layer 74.

As described above, the electrophoresis device 71 is configured to provide contrast by a difference in light reflectivity between the migrating particles 73 and the porous layer 74. More specifically, light reflectivity of one that performs display in the bright state of the migrating particles 73 and the porous layer 74 is higher than light reflectivity of the other that performs display in the dark state. The light reflectivity of the non-migrating particles 74C may be preferably higher than that of the migrating particles 73 to allow display in the bright state and display in the dark state to be respectively performed by the porous layer 74 and the migrating particles 73. Performing such display remarkably increases, with use of light diffusion by the porous layer 74 (a three-dimensional steric structure), the light reflectivity when display in the bright state is performed. Accordingly, contrast is remarkably improved.

In the electrophoresis device 71, the migrating particles 73 move through the pores 74A of the porous layer 74 within a range where an electric field is applied. One of display in the bright state and display in the dark state is performed according to a region where the migrating particles 73 move and a region where the migrating particles 73 do not move, thereby displaying an image.

FIG. 16 illustrates an example of a sectional configuration of an electronic device (display unit) 2 using the electrophoresis device 71 as the display body 70. This electronic device 2 is an electrophoretic display (a so-called electronic paper display) that displays an image (for example, textual information) with use of an electrophoretic phenomenon. The electronic device 2 may be configured of, for example, the function section 3 including the TFT layer 60 and the electrophoresis device 71 as the display body 70 provided on the substrate 1.

The TFT layer 60 may include, for example, TFTs (Thin Film Transistors) 61, a protective layer 62, and a planarization insulating layer 63.

The TFTs 61 and each a switching device for selecting a pixel. The TFTs 61 may be each an inorganic TFT using an inorganic semiconductor layer as a channel layer or an organic TFT using an organic semiconductor layer. The protective layer 62 and the planarization insulating layer 63 may be made of, for example, an insulating resin material such as polyimide. As long as a surface of the protective layer 62 is sufficiently flat, the planarization insulating layer 63 may be omitted.

The display body 70 includes pixel electrodes 75, the foregoing electrophoresis device 71, and a counter substrate 76. A spacer 77 is provided between, the TFT layer 60 and the counter substrate 76.

The pixel electrodes 75 may be formed of, for example, a metal material such as gold (Au), silver (Ag), or copper (Cu). The pixel electrodes 75 are coupled to the TFTs 61 through contact holes (not illustrated) provided in the protective layer 62 and the planarization insulating layer 63. The TFTs 61 and the pixel electrodes 75 may be arranged, for example, in a matrix form or a segment form according to a pixel arrangement.

The counter substrate 76 may include, for example, a plate-like member 76A and a counter electrode 76B, and the counter electrode 76B is provided on an entire surface (a surface facing the substrate 1) of the plate-like member 76A. The counter electrode 76B may be provided in a matrix form or a segment form as with the pixel electrodes 75.

The plate-like member 76A has light transparency, and may be made of, for example, an organic material, a metal material, or a plastic material. Examples of the inorganic material may include silicon (Si), silicon oxide ($SiO_x$), silicon nitride ($SiN_x$), and aluminum oxide ($AlO_x$). The silicon oxide may include, for example but not limited to, glass and spin-on glass (SOG). Examples of the metal material may include aluminum (Al), nickel (Ni), and stainless steel, and examples of the plastic material may include polycarbonate (PC), polyethylene terephthalate (PET), polyethylene naphthalate (PEN), and poly ether ether ketone (PEEK).

For the counter electrode 76B, for example, a light-transmissive conductive material (a transparent electrode material) such as indium oxide-tin oxide (ITO), antimony oxide-tin oxide (ATO), fluorine-doped tin oxide (FTO), or aluminum-doped zinc oxide (AZO) may be used.

In a case where an image is displayed on the counter substrate 76 side, the electrophoresis device 71 is viewed through the counter electrode 76B; therefore, the light transparency (transmittance) of the counter electrode 76B may be preferably as high as possible, and may be, for example, 80% or more. Moreover, electrical resistance of the counter electrode 76B may be preferably as low as possible, and may be, for example, 100 Ω/sq or less.

The electrophoresis device 71 includes the migration particles 73 and the porous layer 74 having a plurality of pores 74A in the insulating liquid 72 as described above. A space between the TFT layer 60 and the counter substrate 76 is filled with the insulating liquid 72, and the porous layer 74 may be supported by, for example, the spacer 77. The space filled with the insulating liquid 72 may be partitioned with, for example, the porous layer 74 as a boundary into an escape region R1 on side closer to the pixel electrode 75 and a display region R2 on side closer to the counter electrode 76B. The configurations of the insulating liquid 72, the migrating particles 73, and the porous layer 74 are similar to those described above. It is to be noted that, in FIG. 16 and FIG. 17 to be described later, for simplification of the diagrams, only part of the pores 74A is illustrated.

The porous layer 74 may be adjacent to one of the pixel electrodes 75 and the counter electrode 76B, and the escape region R1 and the display region R2 may not be clearly partitioned. The migrating particles 73 move toward the pixel electrodes 75 or the counter electrode 76B according to an electric field.

A thickness of the spacer 77 may be, for example, 10 μm to 100 μm both inclusive, and may be preferably as thin as possible. This makes it possible to reduce power consumption. The spacer 77 may be made of, for example, an insulating material such, as a polymer material, and may be provided in, for example, a grid pattern, between the TFT layer 60 and the counter substrate 76. The disposition and the shape of the spacer 77 are not specifically limited; however, the spacer 77 may be preferably so provided as not to interfere with movement of the migrating particles 73 and as to uniformly distribute the migrating particles 73.

In the electronic device 2 in an initial state, the migrating particles 73 are provided in the escape region R1 (refer to FIG. 16). Since, in this case, the migrating particles 73 are shielded by the porous layer 74 in all pixels, when the electrophoresis device 71 is viewed from the counter substrate 76 side, the electrophoresis device 71 is in a state in which contrast is not provided (an image is not displayed).

When pixels are selected by the TFTs 61, and an electric field is applied between the pixel electrodes 75 and the counter electrode 76A, as illustrated in FIG. 17, in each of the pixels, the migrating particles 73 move from the escape region R1 to the display region R2 through the porous layer 74 (the pores 74A). Since, in this case, pixels in which the migrating particles 73 are shielded by the porous layer 74 and pixels in which the migrating particles 73 are not shielded by the porous layer 74 coexist, when the electrophoresis device 71 is viewed from the counter substrate 76 side, the electrophoresis device 71 is in a state in which contrast is provided. Thus, an image is displayed.

In the embodiment, the planarization film 20 is formed on the surface of the material substrate 10 after the surface of the material substrate 10 is polished, and this makes it possible to cope with both the recessed defects 12 and the protruding defects 11 on the surface of the material substrate 10, thereby obtaining the subsume 1 having superior surface smoothness with few recessed defects and few protruding defects. This makes it possible to reduce damage to electronic elements such as the TFT layer 60 and improve yields.

Moreover, in order to form an electronic circuit on the flexible material substrate 10 made of a plastic sheet, high surface smoothness is desired in consideration of an influence on electric characteristics, and options of the material substrate 10 are limited. In the embodiment, it is possible to use the material substrate 10 having surface smoothness that is not so high, thereby increasing options of the material substrate 10.

Further, in order to form the electronic circuit on the flexible material substrate 10 made of the plastic sheet, the material substrate 10 with few recessed defects and few protruding defects may be preferable, and setting acceptance criteria of the material substrate 10 to a high level, causes an increase in cost. In the embodiment, it is possible to relax the acceptance criteria of the material substrate 10, thereby reducing the cost of the material substrate 10.

Modification Example 1

FIG. 18 illustrates a flow of a method of manufacturing the substrate 1 according to Modification Example 1. This modification example is the same as the method of manufacturing the substrate 1 according to the foregoing embodiment, except that as the planarization film 20, an inorganic film that also serves as a barrier coat is formed. Therefore, same processes as those in the foregoing embodiment will be described with reference to FIGS. 2 to 4.

(Process of Bonding Material Substrate 10 to Support 30)

First, the material substrate 10 is bonded to the support 30 with use of the adhesive layer 40 by the process illustrated in FIGS. 2 and 3 in a similar manner to that in the foregoing embodiment (step S101 in FIG. 18).

(Process of Polishing Surface of Material Substrate 10)

Next, the surface of the material substrate 10 is polished by the process illustrated in FIG. 4 in a similar manner to that in the foregoing embodiment (step S102 in FIG. 18). Thus, the protruding defects 11 present on the surface of the material substrate 10 are scraped off.

(Cleaning and Pretreatment)

Next, the surface of the material substrate 10 is cleaned in preparation for formation of the planarization film 20 in a subsequent process (step S103 in FIG. 18), and pretreatment is performed (step S104 in FIG. 18).

(Process of Forming Planarization Film 20 on Surface of Material Substrate 10)

Thereafter, the planarization film 20 is formed on the surface of the material substrate 10 as illustrated in FIG. 19 (step S108 in FIG. 18). Thus, the recessed defects 12 present on the surface of the material substrate 10 and the polishing flaws 13 caused by the polishing process are filled with the planarization film 20. Concurrently with this, the protruding defects 11 remaining after polishing are covered with the planarization film 20. Thus, the smooth surface of the planarization film 20 is formed.

In this modification example, as the planarization film 20, the inorganic film, also serving as the barrier coat is formed. Examples of a material of the inorganic film may include a SiOx film, a SiNx film, a SiON film, and an $Al_2O_3$ film. It is to be noted that the planarization film 20 may be a hybrid film of a resin film and an inorganic film, as long as the hybrid film has barrier coat performance.

As a technique of forming the planarization film 20, slit coating, screen printing, gravure coating, spin coating, spray coating, CVD, ALD, a sputtering method, or any other method may be used.

In a case where there is a great difference in thermal behavior between the planarization film 20 and the material substrate 10, strain stress is accumulated by a thermal process in a manufacturing process. For example, in a case where a difference in thermal expansion coefficient is large, substrate warpage or film peeling may occur in a heating process, and in a case where a difference in heat shrinkage is large, substrate warpage or film peeling may occur when the temperature returns to a room temperature after the heating process. For this reason, the planarization film 20 may be preferably made of a material having same or substantially same thermal behavior such as the thermal expansion, coefficient and heat shrinkage. Moreover, the planarization film 20 may be preferably made of a material having a high affinity in, for example hut not limited to, a chemical composition and a functional group for the material substrate 10. In addition, the planarization film 20 may preferably have heat resistance to a temperature during formation of the function section 3 in a later process.

The thickness T20 of the planarization film 20 may be preferably smaller than the thickness T10 of the material substrate 10. In a case where the material substrate 10 is thinner than the planarization film 20, the protruding defects 11 remaining after polishing of the surface of the material substrate 10 may not be covered. Moreover, when the heat shrinkage of the planarization film 20 is large, film shrinkage of the planarization film 20 is increased by a heating process during the formation of the function section in the later process to cause warpage of the substrate 1. Further, the larger the thickness T20 is, the more an influence thereof is increased. Accordingly, the thickness T20 of the planarization film 20 may be preferably, for example, equal to or smaller than one-fifth of the thickness T10 of the material substrate 10, more preferably equal to or smaller than one-seventh, and still more preferably equal to or smaller than one-tenth.

(Post-Baking)

It is to be noted that in a case where the hybrid film of the resin film and the inorganic film is formed as the planarization film 20, after the planarization film 20 is formed on the surface of the material substrate 10, sintering (post-baking) of the planarization film 20 may be performed with, for example but not limited to, an oven or an IF (infrared) furnace. A temperature when this process is performed may be preferably equal to or lower than heat resistant temperatures of materials of respective layers of a stacking structure including the material substrate 10, the planarization film 20, the support 30, and the adhesive layer 40. Moreover, a baking temperature when this process is performed may be preferably a temperature at which the resin film is not decomposed in a later process. Further, heating may be preferably performed sufficiently until gas is not released from the resin film or any other film to the utmost, and the substrate 1 is thus completed.

Modification Example 2

Next, Modification Example 2 will be described below wife reference to FIGS. 20 to 22. In this modification example, an organic EL device 81 is formed as the display body 70, and an organic EL display is manufactured as the electronic device 2.

FIG. 20 illustrates an example of a sectional configuration of the electronic device (display unit) 2 using the organic EL device 81 as the display body 70. This electronic device 2 is an organic EL display that displays an image with use of light emission from the organic EL device 81, and may be configured of, for example, the function section 3 including the TFT layer 60 and the organic EL device 81 as the display body 70 provided on the substrate 1.

The TFT layer 60 may include, for example, TFTs 64 and a planarization insulating layer 65.

The TFTs 64 are each a so-called bottom gate TFT that may use, for example, an oxide semiconductor for a channel (an active layer). In each of the TFTs 64, a gate electrode 64A, gate insulating films (a first gate insulating film 64B and a second gate insulating film 64C), an oxide semiconductor layer 64D, a channel protective film 64E, and a source-drain electrode 64F are formed in this order on the substrate 1. The planarization insulating layer 65 configured to eliminate recessions and protrusions caused by the TFTs 64 to planarize the entire surface of the substrate 1 is formed on the source-drain electrode 64F.

The gate electrode 64A fulfills a role in controlling carrier density (herein, electron density) in the oxide semiconductor layer 64D by a gate voltage to be applied to the TFT 64. The gate electrode 64A may be configured of a single-layer film made of one of, for example, Mo, Al, and an aluminum alloy, or a multilayer film made of two or more of them. It is to be noted that examples of the aluminum alloy may include an aluminum-neodymium alloy.

The first gate insulating film 64B and the second gate insulating film 64C may each be a single-layer film made of one of $SiO_2$, $Si_3N_4$, silicon, oxynitride (SiON), and aluminum oxide ($Al_2O_3$), or a multilayer film made of two or more of them. Herein, the first gate insulating film 64B and the second gate insulating film 64C have a two-layer configuration, and the first gate insulating film 64B may be configured of a $SiO_2$ film, and the second gate insulating film 64C may be configured of, for example, $Si_3N_4$ film. The total film thickness of the first gate insulating film 64B and the second gate insulating film 64C may be, for example, 200 nm to 300 nm both inclusive.

The oxide semiconductor layer 64D may include, for example, an oxide of one or more of indium (In), gallium (Ga), zinc (Zn), tin (Sn), Al, and Ti as a main component. The oxide semiconductor layer 64D is configured to form a channel between the source-drain electrodes 64F by application of a gate voltage. The oxide semiconductor layer 64D may preferably have a life thickness that does not cause deterioration in on-current of a thin film transistor so as to exert an influence of a negative charge on a channel, and more specifically, may preferably have a film thickness of 5 nm to 100 nm both inclusive.

The channel protective film 64E is formed on the oxide semiconductor layer 64D, and is configured to prevent damage to the channel during formation of the source-drain electrode 64F. A thickness of the channel protective film 64E may be, for example, 10 nm to 300 nm both inclusive.

The source-drain electrode 64F may be, for example, a single-layer film made of one of Mo, Al, copper (Cu), Ti, ITO, and TiO, or a multilayer film made of two or more of them. For example, a three-layer film in which films of Mo, Al, and Mo with respective film thicknesses of 50 nm, 500 nm, and 50 nm are stacked in this order, or a metal or a metal compound weakly combined with oxygen such as a metal compound including oxygen, for example but not limited to, ITO and titanium oxide may be preferably used. This makes it possible to stably maintain electrical properties of the oxide semiconductor.

For the planarization insulating layer 65, for example, an organic material such as polyimide and novolak may be used. A thickness of the planarization layer 27 may be, for example, 10 nm to 100 nm both inclusive, and may be preferably 50 nm or less. An anode electrode 82 of the organic EL device 81 is formed on the planarization insulating layer 65.

The organic EL device 81 has a configuration in which the anode electrode 82, a partition wall insulating film 83, an organic layer 84 including a light-emitting layer, a cathode electrode a protective layer 86, and a sealing substrate 87 are stacked in this order on the TFT layer 60. The organic EL device 81 is a top emission display device in which emission light generated by recombining holes injected from the anode electrode 82 and electrons injected from the cathode electrode 85 is the light-emitting layer of the organic layer 84 is extracted from side opposite to the substrate 1 (from the cathode electrode 83 side). Using the top emission organic EL device 81 allows an aperture ratio of a light emission section of the electronic device (display unit) 2 to be improved. It is to be noted that the organic EL device 81 of the disclosure is not limited to such a configuration, and may be, for example, a transmissive, i.e., bottom emission display device in which light is extracted from the substrate 1 side.

For example, in a case where the electronic device (display unit) 2 is of a top emission type, the anode electrode 82 may be made of, for example, a highly reflective material such as Al, Ti, or Cr. In a case where the electronic device (display unit) 2 is of a transmissive type, a transparent material for example, ITO, IZO, or IGZO may be used for the anode electrode 82.

The partition wall insulating film 83 is formed of an organic material such as polyimide or novolak, and has a function of securing insulation between the anode electrode 82 and the cathode electrode 85. The partition wall insulating film 83 is so provided as to enclose a light emission region of the anode electrode 82, and is provided on a coupling section, between the source-drain electrode 64F of the TFT 64 and the anode electrode 82.

Although not illustrated, the organic layer 84 has a configuration in which a hole injection layer, a bole transport layer, a light-emitting layer, an electron transport layer, and an electron injection layer are stacked in order from the anode electrode 82. The organic layer 84 may be formed by, for example, a vacuum deposition method or a spin coating method. A top surface of the organic layer 84 is covered with the cathode electrode 85. Non-limiting examples of film thicknesses and materials of respective layers forming the organic layer 84 are described below.

The hole injection layer is a buffer layer-configured to enhance bole infection efficiency to the light-emitting layer and to prevent leakage. A thickness of the hole injection layer may be preferably, for example, 5 nm to 200 nm both inclusive, and more preferably 8 nm to 150 nm both inclusive. A material of the hole injection layer may the appropriately selected, depending on a relationship with the material of an electrode or a layer adjacent thereto, and examples of the material may include polyaniline, polythiophene, polypyrrole, polyphenylene vinylene, polythienylene vinylene, polyquinoline, polyquinoxaline, and derivatives thereof, a conductive polymer such as a polymer including an aromatic amine structure in a main chain or a side chain, metal phthalocyanine (such as copper phthalocyanine), and carbon. Specific examples of the conductive polymer may include oligoaniline and polydioxythiophene such as poly(3,4-ethylenedioxythiophene) (PEDOT).

The hole transport layer is configured to enhance hole transport efficiency to the light-emitting layer. A thickness of the hole transport layer 15B depends on an entire device configuration, but may be preferably for example, 5 nm to 200 nm both inclusive, and more preferably 8 nm to 150 nm both inclusive. As a material forming the hole transport layer, a light-emitting material soluble in an organic solvent, for example, polyvinylcarbazole, polyfluorene, polyaniline, polysilane, and derivatives thereof, a polysiloxane derivative having an aromatic amine in a side chain or a main chain, polythiophene and a derivative thereof, polypyrrole, and Alq3 may be used.

The light-emitting layer is configured to emit tight by the recombination of electrons and holes in response to the application of an electric field. A thickness of the light-emitting layer depends on the entire device configuration, but may be preferably, for example, 10 nm to 200 nm both inclusive, and more preferably 20 nm to 150 nm both inclusive. The light-emitting layer may have a single-layer or multilayer configuration. More specifically, red, green, and blue light-emitting layers may be provided on the hole transport layer in a single layer form. Alternatively, the blue light-emitting layer may serve as a common layer shared by red, green and blue organic EL devices, and the blue light-emitting layer may be stacked on the red light-emitting layer in the red organic EL device, and the blue light-emitting layer may be stacked on the green light-emitting layer in the green organic EL device. Moreover, the red light-emitting layer, the green light-emitting layer, and the blue light-emitting layer may be stacked, thereby forming a white organic EL device.

As a material forming the light-emitting layer, a material according to its emission color may be used, and examples of the material may include a polyfluorene-based polymer derivative, a (poly)paraphenylene vinylene derivative, a polyphenylene derivative, a polyvinylcarbazole derivative, a polythiophene derivative, a perylene-based pigment, a coumarin-based pigment, a rhodamine-based pigment, and the foregoing polymer material doped with an organic EL material. As a doping material, for example, rubrene, perylene, 9,10-diphenylanthracene, tetraphenyl butadiene, nile red, or Coumarin6 may be used. It is to be noted that as the material forming the light-emitting layer, a mixture of two or more of the foregoing materials may be used. Moreover, a combination of not only the foregoing materials with a high molecular weight but also materials with a low molecular weight may be used. Examples of a low-molecular-weight material may include benzene, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene, and derivatives thereof, and a heterocyclic conjugated monomer or oligomer such as a polysilane-based compound, a vinylcarbazole-based compound, a thiophene-based compound, or an aniline-based compound.

As the material forming the light-emitting layer, a material having high light emission efficiency, for example, an organic light-emitting material such as a low-molecular-weight fluorescent material, a fluorescent dye, or a metal complex may be used as a light-emitting guest material other than the foregoing materials.

It is to be noted that the light-emitting layer may be, for example, a light-emitting layer having hole transport properties that also serves as the foregoing hole transport layer or a light-emitting layer having electron transport properties that also serves as the electron transport layer.

The electron transport layer and the electron injection layer are configured to enhance electron transport efficiency to the light-emitting layer. The total film thickness of the electron transport layer and the electron injection layer depends on the entire device configuration, but may be preferably, for example, 5 nm to 200 nm both inclusive, and more preferably 10 nm to 180 nm both inclusive. As a material of the electron transport layer, an organic material having superior electron transport capability may be preferably used. Enhancing the electron transport efficiency to the light-emitting layer suppresses a change in light emission color by electric field strength. More specifically, for example, an arylpyridine derivative and a benzimidazole derivative may be preferably used. This allows electron supply efficiency to be maintained even at a low drive voltage. Non-limiting examples of a material of the electron injection layer may include an alkali metal, an alkali-earth metal, a rare-earth metal, and oxides thereof, a complex oxide, a fluoride, and a carbonate.

It is to be noted that the organic layer 84 may be formed by, in addition to the vacuum deposition method and the spin coating method, a coating method such as a dipping method, a doctor blade method, a discharge coating method, and a spray coating method, and a printing method such as an ink-jet printing method, an offset printing method, a relief printing method, an intaglio printing method, a screen printing method, and a micro-gravure coating method, and both a dry process and a wet process may be used, depending on properties of each layer or each member.

The cathode electrode 85 may have, for example, a thickness of about 10 nm, and may be made of a material having superior light transparency and a small work function. Moreover, forming a transparent conductive film with use of an oxide also makes it possible to assure light extraction. In this case, ZnO, ITO, IZnO, InSnZnO, or any other oxide may be used. The cathode electrode 85 may have a single-layer or multilayer configuration.

Moreover, in a case where the organic EL device 81 has a cavity structure, the cathode electrode 85 may be preferably made of a translucent semi-reflective material. Emitted light multiply interfered between a light reflection surface of the anode electrode 82 and a light reflection surface of the cathode electrode 85 is thereby extracted from the cathode electrode 85. In this case, an optical distance between the light reflection surface of the anode electrode 82 and the light reflection surface of the cathode electrode 85 is defined by the wavelength, of light that is desired to be extracted, and a film thickness of each layer is so set as to satisfy the optical distance. In such a top emission organic EL device 81, actively using the cavity structure makes it possible to improve light extraction efficiency to outside and control an emission spectrum.

The protective layer 86 is configured to prevent entry of moisture into the organic layer 84, and is formed of a material having low transparency and low water permeability with a thickness of for example, 2 µm to 3 µm both inclusive. As a material of the protective layer 86, one of an insulating material and a conductive material may be used. As the insulating material, an inorganic amorphous insulating material, for example, amorphous silicon (α-Si), amorphous silicon carbide (α-SiC), amorphous silicon nitride (α-$Si_{1-x}N_x$), and amorphous carbon (α-C) may be preferable. Since such an inorganic amorphous insulating material does not form, grains, the inorganic amorphous insulating material has low water permeability, thereby forming a favorable protective film.

The sealing substrate 8 is located on the cathode electrode 85 side of the organic EL device 81, and is configured to seal the organic EL device 81 together with an adhesive layer (not illustrated). The sealing substrate 87 is made of a material such as glass, transparent to light generated by the organic EL device 81. For example, a color filter and a light-shielding film as a black matrix (both not illustrated) may be provided to the sealing substrate 81, and thus, light generated in the organic EL device 81 is extracted, and outside light reflected in wiring lines between respective organic EL devices 10 is absorbed, thereby improving contrast.

The color filter includes a red filter, a green filter, and a blue filter (all not illustrated) that are sequentially provided. The red filter, the green filter, and the blue filter may be closely formed in a rectangular shape. Each of the red filter, the green filter, and the blue filter is made of a resin mixed with a pigment, and is adjusted by selecting the pigment in have high light transmittance in a wavelength region of target red, green, or blue and low light transmittance in other wavelength regions.

The light-shielding film may be configured of, for example, a black resin film that is mixed with a black colorant and has optical density of 1 or more, or a thin film filter using interference of a thin film. In particular, the light-shielding film may be preferably configured of the black resin film, which makes it possible to form the light-shielding film easily at low cost. The thin film filter may be configured, for example, by stacking one or more thin films made of a metal, a metal nitride, or a metal oxide, and is configured to attenuate light with use of interference of the thin films. A specific example of the thin film filter may be a thin film filter in which Cr and chromium (III) oxide ($Cr_2O_3$) are alternately stacked.

FIG. 21 illustrates a schematic configuration of the electronic device (display unit) 2. The electronic device (display unit) 2 may be used as, for example but not limited to, an organic EL television, and the function section 3 including the TFT layer 60 and the display body 70 is formed on the substrate 1. The function section 3 has a display region 110A and a peripheral region 110B on the substrate 1. In the display region 110A, red organic EL devices 81R that generate red light, green organic EL devices 81G that generate green light, and blue organic EL devices 81B that generate blue light are sequentially arranged in a matrix as a whole. The peripheral region 110B is provided to enclose the display region 110. In the peripheral region 110B, a signal line drive circuit 120 and a scanning line drive circuit 130 as drivers for image display are provided.

A pixel drive circuit 140 is provided in the display region 110. FIG. 22 illustrates an example of the pixel drive circuit 140. The pixel drive circuit 140 may be an active drive circuit formed in the TFT layer 60 below the anode electrode 81. In other words, the pixel drive circuit 140 includes a driving transistor Tr1, a writing transistor Tr2, a capacitor (a retention capacitor) Cs between the transistors Tr1 and Tr2, and the red organic EL device 81R (or the green organic EL device 81G or the blue organic EL device 81B) coupled in series to the driving transistor Tr1 between a first power supply line (Vcc) and a second power supply line (GND). Each of the driving transistor Tr1 and the writing transistor Tr2 may be configured of a bottom gate oxide semiconductor TFT such as the TFT 64 illustrated in FIG. 20.

In the pixel drive circuit 140, a plurality of signal lines 120A are provided along a column direction, and a plurality of scanning lines 130A are provided along a row direction. An intersection of each signal line 120A and each scanning line 130A corresponds to one of the red organic EL device 81R, tire green organic EL device 81G, and the blue organic EL device 81B. Each of the signal lines 120A is coupled to the signal line drive circuit 120, and an image signal is supplied from the signal line drive circuit 120 to a source electrode of the writing transistor Tr2 through the signal line 120A. Each of the scanning lines 130A is coupled to the scanning line drive circuit 130, and a scanning signal is sequentially supplied from the scanning line drive circuit 130 to a gate electrode of the writing transistor Tr2 through the scanning line 130A.

In this electronic device (display unit) 2, the scanning signal is supplied from the scanning line drive circuit 130 to each pixel through the gate electrode of the writing transistor Tr2, and the image signal from the signal line drive circuit 120 is retained in the retention capacitor Cs through the writing transistor Tr2. In other words, on-off control of the driving transistor Tr1 is performed according to the signal retained in the retention capacitor Cs, and a drive current Id is thereby injected into the organic EL devices 81 to allow the organic EL devices 81 to emit light by the recombination of holes and electrons. In a case of bottom emission, this light passes through the anode electrode 82 and the substrate 1 to be extracted, and in a case of top emission, this light passes through the cathode electrode 85, the color filter (not illustrated), and the sealing substrate 87 to be extracted.

Application Examples

Application Examples of the foregoing electronic device (display unit) 2 to electronic apparatuses will be described below. Examples of the electronic apparatuses may include a television, a digital camera, a notebook personal computer, a mobile terminal unit such as a mobile phone, and a video camera. In other words, the foregoing display unit is applicable to electronic apparatuses, in any fields, that display an image signal inputted from outside or an image signal produced inside as an image or a picture.

Application Example 1

FIGS. 23 and 24 each illustrate an appearance configuration of an electronic book 210. The electronic book 210 may include, for example, a display section 211 and a non-display section 212, and an operation section 213. It is to be noted that the operation section 213 may be provided on a front surface of the non-display section 212 as illustrated in FIG. 23, or on a top surface of the non-display section 212 as illustrated in FIG. 24. The display section 211 is configured of the electronic device (display unit) 2. It is to be noted that the electronic device (display unit) 2 may be mounted on a PDA (Personal Digital Assistants) with a similar configuration to that of the electronic book illustrated in FIGS. 23 and 24.

Application Example 2

FIG. 25 illustrates an appearance of a smartphone 220. The smartphone 220 may include, for example, a display section 221 and a non-display section 222. The display section 221 is configured of the electronic device (display unit) 2.

Application Example 3

FIG. 26 illustrates an appearance of a television 230 to which the display unit of the foregoing embodiment is applied. The television 230 may include, for example, an image display screen section 233 including a front panel 231 and a filter glass 232. The image display screen section 233 is configured of the electronic device (display unit) 2.

Application Example 4

FIG. 27 illustrates an appearance of a tablet personal computer 240. The tablet personal computer 240 may include, for example, a touch panel section 241 and an enclosure 242, and the touch panel 241 is configured of the electronic device (display unit) 2.

Application Example 5

FIGS. 28 and 29 each illustrate an appearance of a digital still camera 250. The digital still camera 250 may include, for example, a light-emitting section 251 for a flash, a display section 252, a menu switch 253, and a shutter button 254, and the display section 252 is configured of the electronic device (display unit) 2.

Application Example 6

FIG. 30 illustrates an appearance of a notebook personal computer 260. The notebook personal computer 260 may include, for example, a main body 261, a keyboard 262 for operation of inputting, for example but not limited to, characters, and a display section 263 that displays an image, and the display section 263 is configured of foe electronic device (display unit) 2.

Application Example 7

FIG. 31 illustrates an appearance of a video camera 270. The video camera 270 may include, for example, a main body section 271, a lens 272 provided on a front side surface of the main body section 271 and for shooting an image of a subject, a shooting start and stop switch 273, and a display section 274. The display section 274 is configured of the electronic device (display unit) 2.

Application Example 8

FIGS. 32 and 33 each illustrate an appearance of another electronic book 280. The electronic book 280 is a thin flexible display formed with a component made of a soft material. In this electronic book 280, like an actual book formed by binding a plurality of pieces of paper (pages), it is possible to close (fold) or open the entire apparatus. A user is allowed to browse contents (for example, a page of a hook) displayed on the electronic book 3 while having a feeling of actually reading a book.

The electronic book 280 includes a display section 282 on a supporting substrate 281, and includes a hinge section 283 on a "spine" section (a spine 283A) corresponding to the spine of a book. A cover 284 configured of a soft resin film is provided on a bottom surface (a surface located outside when closed) of the electronic book 280, and a top surface (a surface located inside when closed) is covered with a protective sheet 283 configured of a soft resin film transparent to display light. The display section 282 is configured of the electronic device (display unit) 2.

Application Example 9

FIGS. 34 and 35 each illustrate an appearance of a mobile phone 290. The mobile phone 290 may be configured of, for example, a top-side enclosure 291 and a bottom-side enclosure 292 that are connected together through a connection section (hinge section) 293, and the mobile phone may include a display 294, a sub-display 295, a picture light 296, and a camera 297. The display 294 or the sub-display 295 is configured of the electronic device (display unit) 2.

Although the technology is described referring to, for example but not limited to, the embodiments, the technology is not limited thereto, and may be variously modified. For example, in the foregoing embodiment, the electron paper display and the organic EL display unit are described as the electronic device (display unit) 2; however, the electronic device (display unit) 2 may be any other display unit such as a liquid crystal display unit. Moreover, the electronic device 2 of the technology may be applied to, for example but not limited to, a sensor in addition to the display unit.

Further, the material and thickness of each layer, the method and conditions of forming each layer are not limited to those described in, for example but not limited to, the foregoing embodiments, and each layer may be made of any other material with any other thickness by any other method under any other conditions.

Furthermore, in for example but not limited to, the foregoing embodiments, the configurations of the substrate 1 and the electronic device 2 are specifically described; however, the substrate 1 and the electronic device 2 of the technology are not limited to a configuration including all Illustrated constituent components. In addition, some of the constituent components may be replaced with other constituent components.

The technology may have following configurations.

(1) A method of manufacturing a substrate, the method including:

polishing a surface of a material substrate; and forming a planarization film on the surface of the material substrate after the polishing of the surface of the material substrate.

(2) The method of manufacturing the substrate according to (1), in which the polishing and the forming of the planarization film are performed in a state in which the material substrate is bonded to a support.

(3) The method of manufacturing the substrate according to (1) or (2), in which the planarization film is made of a material having a same or substantially same linear expansion coefficient as a linear expansion coefficient of the material substrate.

(4) The method of manufacturing the substrate according to any one of (1) to (3), in which the planarization film is made of a material having same or substantially same heat shrinkage as heat shrinkage of the material substrate.

(5) The method of manufacturing the substrate according to any one of (1) to (4), in which a thickness of the planarization film is smaller than a thickness of the material substrate.

(6) The method of manufacturing the substrate according to (5), in which the thickness of the planarization film is one-fifth or less of the thickness of the material substrate.

(7) The method of manufacturing the substrate according to any one of (1) to (6), in which, in the polishing of the surface of the material substrate, an entirety of the surface of the material substrate is polished.

(8) The method of manufacturing the substrate according to (7), in which, in the polishing of the surface of the material substrate, the polishing is performed until a height of a protruding defect present on the surface of the material substrate is reduced to a value equal to or smaller than a thickness of the planarization film.

(9) The method of manufacturing the substrate according to (8), in which, in the polishing of the surface of the material substrate, a depth of a polishing flaw of the material substrate is reduced to a value equal to or smaller than the thickness of the planarization film.

(10) The method of manufacturing the substrate according to any one of (1) to (9), in which the material substrate is made of a resin sheet having flexibility.

(11) The method of manufacturing the substrate according to any one of (1) to (10), in which a resin film is formed as the planarization film.

(12) The method of manufacturing the substrate according to any one of (1) to (11), further including forming a barrier coat configured of an inorganic film on a surface of the planarization film.

(13) The method of manufacturing the substrate according to any one of (1) to (10), in which, as the planarization film, an inorganic film that also serves as a hairier coat is formed.

(14) A method of manufacturing an electronic device, the method including:
    forming a substrate; and
    forming a function section on the substrate,
    the forming of the substrate including
    polishing a surface of a material substrate, and
    forming a planarization film on the surface of the material substrate after the polishing of the surface of the material substrate.

(15) The method of manufacturing the electronic device according to (14), in which the polishing and the forming of the planarization film are performed in a state in which the material substrate is bonded to a support.

(16) The method of manufacturing the electronic device according to (15), further including, after the forming of the function section on the substrate:
    removing a substrate body including the material substrate and the planarization film from the support; and
    cutting the substrate body to form a module.

(17) The method of manufacturing the electronic device according to (15), further including, after the forming of the function section on the substrate:
    cutting the substrate to form a module; and
    removing a substrate body including the material substrate and the planarization film from the support.

This application claims the benefit of Japanese Priority Patent Application JP 2013-147741 filed on Jul. 16, 2013, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A method of manufacturing a substrate, the method comprising:
    bonding a first surface of a material substrate to a support;
    polishing a second surface of the material substrate, such that a height of a protruding defect on the second surface of the material substrate is reduced to a value equal to or less than a first thickness of a planarization film;
    pretreating the second surface of the material substrate; and
    forming the planarization film on the second surface of the material substrate, based on completion of the pretreatment of the second surface of the material substrate.

2. The method of manufacturing the substrate according to claim 1,
    wherein the planarization film comprises a material having a first linear expansion coefficient,
    wherein the material substrate has a second linear expansion coefficient, and
    wherein the first linear expansion coefficient of the planarization film is equal to the second linear expansion coefficient of the material substrate.

3. The method of manufacturing the substrate according to claim 1,
    wherein the planarization film comprises a material having a first heat shrinkage coefficient,
    wherein the material substrate has a second heat shrinkage coefficient, and
    wherein the first heat shrinkage coefficient is equal to the second heat shrinkage coefficient.

4. The method of manufacturing the substrate according to claim 1, wherein the first thickness of the planarization film is less than a second thickness of the material substrate.

5. The method of manufacturing the substrate according to claim 4, wherein the first thickness of the planarization film is less than or equal to one-fifth of the second thickness of the material substrate.

6. The method of manufacturing the substrate according to claim 1, further comprising polishing an entirety of the second surface of the material substrate.

7. The method of manufacturing the substrate according to claim 1, further comprising polishing the second surface of the material substrate, based on reduction of a depth of a polishing flaw of the material substrate to a value equal to or smaller than the first thickness of the planarization film.

8. The method of manufacturing the substrate according to claim 1, wherein the material substrate comprises a flexible resin sheet.

9. The method of manufacturing the substrate according to claim 1, further comprising forming a resin film as the planarization film.

10. The method of manufacturing the substrate according to claim 1, further comprising forming a barrier coat of an inorganic film on the planarization film.

11. The method of manufacturing the substrate according to claim 1, forming a barrier coat of an inorganic film as the planarization film.

12. A method of manufacturing an electronic device, the method comprising:
- bonding a first surface of a material substrate to a support;
- polishing a second surface of the material substrate, such that a height of a protruding defect on the second surface of the material substrate is reduced to a value equal to or less than a first thickness of a planarization film;
- pretreating the second surface of the material substrate;
- forming the planarization film on the second surface of the material substrate, based on completion of the pretreatment of the second surface of the material substrate; and
- forming a function section on the material substrate.

13. The method of manufacturing the electronic device according to claim 12, further comprising:
- removing a substrate body from the support, based on the formation of the function section on the material substrate,
- wherein the substrate body includes the material substrate and the planarization film; and
- cutting the substrate body to form a module.

14. The method of manufacturing the electronic device according to claim 12, further comprising:
- cutting the material substrate to form a module, based on the formation of the function section on the material substrate; and
- removing a substrate body from the support, wherein the substrate body includes the material substrate and the planarization film.

* * * * *